United States Patent
Maruyama

[11] Patent Number: 5,828,224
[45] Date of Patent: *Oct. 27, 1998

[54] TEST CARRIER FOR SEMICONDUCTOR INTEGRATED CIRCUIT AND METHOD OF TESTING SEMICONDUCTOR INTEGRATED CIRCUIT

[75] Inventor: Shigeyuki Maruyama, Kawasaki, Japan

[73] Assignee: Fujitsu, Limited, Kanagawa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 686,052

[22] Filed: Jul. 24, 1996

Related U.S. Application Data

[63] Continuation-in-part of Ser. No. 398,652, Mar. 3, 1995, Pat. No. 5,757,199.

[30] Foreign Application Priority Data

Mar. 18, 1994 [JP] Japan ................................ 6-048850
Jun. 21, 1996 [JP] Japan ................................ 8-161449

[51] Int. Cl.$^6$ .................................................. G01R 31/02
[52] U.S. Cl. ............................................ 324/755; 269/8
[58] Field of Search ..................................... 361/144, 145; 324/754, 760, 72.5, 755, 158.1; 269/8

[56] References Cited

U.S. PATENT DOCUMENTS

| | | | |
|---|---|---|---|
| 4,038,599 | 7/1977 | Bove et al. | 324/158 |
| 4,975,637 | 12/1990 | Frankeny et al. | 324/755 |
| 5,351,876 | 10/1994 | Belcher et al. | 269/8 |
| 5,412,866 | 5/1995 | Wolth et al. | 29/848 |

FOREIGN PATENT DOCUMENTS 7-263504  10/1995  Japan .

*Primary Examiner*—Ernest F. Karlsen
*Assistant Examiner*—Anh Phung
*Attorney, Agent, or Firm*—Nikaido, Marmelstein, Murray & Oram LLP

[57] ABSTRACT

A holding apparatus of a semiconductor device had a configuration for putting a semiconductor device as a chip or a packaged semiconductor device between a first substrate and a second substrate and fitting magnets to the first substrate and magnetic pieces to the second substrate respectively, and the first substrate and the second substrate are fixed by attraction acted between the magnets and the magnetic pieces.

18 Claims, 28 Drawing Sheets

TEST CARRIER FOR SEMICONDUCTOR INTEGRATED CIRCUIT AND METHOD OF TESTING SEMICONDUCTOR INTEGRATED CIRCUIT

This is a Continuation-In-Part (CIP) of U.S. application Ser. No. 08/398,652, filed Mar. 3, 1995, now U.S. Pat. No. 5,757,199.

BACKGROUND OF THE INVENTION

1. Field of the Invention

The present invention relates to a test carrier for a semiconductor integrated circuit and a method of testing the semiconductor integrated circuit. More particularly, the present invention relates to a test carrier for holding a semiconductor integrated circuit subject to an accelerated test etc. and a method of testing the semiconductor integrated circuit by using the test carrier.

2. Description of the Prior Art

Recently, a high integration of the semiconductor integrated circuit (LSI) has been required and demand for downsizing of electronic devices has increased. In order to satisfy these requirements, not only the high integration of elements in the LSI is required but also a high density packaging technology of the semiconductor chip is required. Such high density packaging technology becomes dominant in the fields of bare chip packaging, a MCM (multi-chip module) and the like. And, under such situation, electrodes on a bare chip in the LSI and terminals of CSP (Chip Size Package) in the LSI are also formed with high density.

In the above circumstances, various attempts have been made to test the LSI as a bare chip.

Before the LSI is supplied to the user as a product in a bare chip state, both a thermally accelerated test (referred to as a Burn In (B.I) test hereinafter) and a Final Test (FT) are conducted in the bare chip state to detect initial defects of the LSI. In the B.I test, while heating the semiconductor integrated circuit, the various electric properties thereof are examined.

If a product like the MCM, in which a plurality of semiconductor chips are formed into one package, includes only one defect chip in the package, an entire product becomes defective. Therefore, the bare chip test is inevitably required for each individual bare chip. Thus, in the product in which a plurality of semiconductor chips are mounted in one package, each semiconductor chip must be subject to the B.I test in the bare chip state. Such test may be required with a greater degree of frequency in future. However, regarding the B.I test conducted in the bare chip state, the testing technology at present has yet to be established.

In general, when the semiconductor integrated circuit formed on the semiconductor wafer is tested, a so-called PP (Production Probe) test has been frequently utilized wherein test probes electrically connected to the testing apparatus are contacted to minute electrodes formed on the surface of the semiconductor wafer.

A first test method may be considered to comprise the application of the PP test together with the use of the B.I test used for the bare chips of the semiconductor integrated circuit.

According to the first test method, as shown in FIG. 1, probes 1 connected to the electric characteristic detecting apparatus (not shown) are contacted to minute electrodes 2A formed on the surface of the semiconductor chip 2. In this situation, the probes 1 and the semiconductor chip 2 are then placed in the heating furnace. The B.I test is then carried out while the semiconductor integrated circuit on the semiconductor chip 2 is operated in the high temperature surrounding.

In addition, a second test method may be considered to comprise the application of the B.I test while directly contacting terminals of the IC socket to the electrodes of the bare chip. The terminals of the IC socket are used to test the semiconductor integrated circuit chip packaged by resin etc. Such IC socket is exemplified in FIG. 7.

Furthermore, as shown in FIG. 2A, a third test method may be considered to comprise the application of the B.I test of the semiconductor chip 2 under such conditions that electrodes 2A of the semiconductor chip 2 contact test electrodes 3B formed on the lower surface of the insulating polyimide test sheet 3 and that connecting wiring patterns 3A, which are formed on the upper surface of the test sheet 3 and connected to the test electrodes 3B, connect to the electric characteristic detecting apparatus.

However, in the above first, second and third test methods, the following problems occur.

In the first test method, as shown in FIG. 1, in order to contact the probes 1 to the minute electrodes 2A on the semiconductor chip 2, location displacements between many of probes 1 aligned in high density and the electrodes 2A of the semiconductor chip 2 must be first corrected by an image recognition technique before the probes 1 and the electrodes 2A are connected to each other. The probe 1 is in general very expensive. Moreover, it is not practical to provide an individual semiconductor chip with an alignment device. If this was done, cost would be enormously raised and thereof makes the semiconductor chip very expensive.

According to the second test method, in contrast to the electrodes of the semiconductor chip, top portions of the contact pins of the IC socket vary largely in size and location so that an increased alignment error results in between the IC socket and the semiconductor chip. Further, it is difficult to increase the integration density of the contact pins of the IC socket correspondingly to a miniaturization of the electrodes of the semiconductor chip.

Moreover, according to the third test method, after the electrodes 3B on the test sheet 3 and the contact electrodes 2A of the semiconductor chip 2 are aligned, a location discrepancy between the electrodes 2A and the electrodes 3A is caused due to the vibration generated during the B.I test and the shock generated while carrying the test sheet 3, so that the third test cannot be effected satisfactorily. In addition, since the electrodes 3B of the test sheet 3 is formed minutely and the test sheet 3 is formed by the flexible film such as the polyimide film, stable contacts cannot be obtained between the contact electrodes 2A and the electrodes 3B of the contact sheet 3 unless the entire test sheet 3 is pressed uniformly against the semiconductor chip 2. It can be considered to bond both the electrodes 2A, 3A by solder. But, according to this method, it is hard to remove the semiconductor chip 2 from the test sheet 3 after the test is completed. Therefore, the semiconductor chip 2 so tested cannot be forwarded promptly as the product.

In addition, as the common drawback to the above first to third test methods, when, like the ordinarily packaged IC, the bare chip is tested by the B.I test in the air, defects such as a burning are caused because dusts are attached to the bare chip, and so on. When the chips are heated for a long time in the air, the electrodes of the semiconductor chip are oxidized and thus degraded. Thus packaging and connection characteristics of the semiconductor chip are lowered.

As described above, it is in fact extremely hard to conduct the B.I test in the bare chip state by means of the existing technologies.

Adjustment between electrodes on the bare chip and contact terminals on the testing substrate, and adjustment between terminals of CSP and the contact terminals on the testing substrate are indispensable. To align the bare chip and CSP, there has been the case where a testing substrate having adjustment walls or grooves thereon is used, for example. In general, such adjustment by the walls or the grooves is called as "mech-adjustment".

However, because the bare chips are separated by dicing of the semiconductor wafer, variations are caused in their outer size and their locations with respect to outer shapes of electrodes formed on the bare chip. As a result, the electrodes on the bare chip and the contact terminals on the testing substrate cannot be aligned with good precision. In addition, since a clearance to connect the testing substrate and the bare chip resides, displacement in location is easy to be caused in the clearance.

Hence, a method has been developed wherein adjustment between the electrodes on the bare chip and the contact terminals on the testing substrate is effected by image recognition technique. In this method, respective locations of the electrodes on the bare chip and the contact terminals on the testing substrate are recognized by an image processing apparatus, then locations of the electrodes and the contact terminals are compared with each other, and then displacement between them can be eliminated by moving the bare chip if displacement is recognized between the electrodes and the contact terminals.

In order to align the testing substrate with the bare chip and fix them, a holder 201 shown in FIGS. 3A and 3B has been used.

The holder 201 comprises a pushing plate 203 in which an air through-hole 202 is provided, and a latch portion 204. While a semiconductor device 220 as the bare chip is being held by pull force from a handling head 210 via the air through-hole 202 in the pushing plate 203, the semiconductor device 220 is aligned by means of the image recognizing apparatus, then the handling head 210 is descended to contact the electrodes 221 on the semiconductor device 220 and the contact terminals 223 on the testing substrate 222. In this case, the latch portions 204 are provided on both sides of the pushing plate 203, and the latch portions 204 are formed to engage with flanges 224 on the testing substrate 222.

Accordingly, the semiconductor device 220 is pushed and fixed by the pushing plate 203 against the testing substrate 222.

The holder 201 may also be used, as shown in FIG. 4, even in case the CSP type semiconductor device 230 is fixed to a testing substrate 32 to contact terminals 231 on a semiconductor 230 with contact terminals 233 on a testing substrate 232. In this event, latch portions 204 of the holder 201 are engaged with a bottom of the testing substrate 32 via latch holes 234.

However, in such holder 201, when the latch portions 204 are suited to the testing substrates 222, 232, the pushing plate 203 is vibrated due to shock from the latch portions 204. Therefore, the semiconductor devices 220, 230 are often displaced which leads to readjustment between the semiconductor devices 220, 230 and the testing substrates 222, 232.

SUMMARY OF THE INVENTION

An object of the present invention is to provide an apparatus for holding a semiconductor device capable of holding a semiconductor device on a testing substrate without displacement, a method of fixing a semiconductor device, and a method of detaching a semiconductor device from a holding apparatus.

According to the present invention, in case a semiconductor device is fitted to a holder which is pushed against a substrate, the holder and the substrate are fixed in virtue of magnetic force. For this reason, even if vibrations are caused during conveyance to a testing furnace or during testing after the semiconductor device is fitted to the substrate, the semiconductor device becomes difficult to come off from the substrate.

In addition, if a permanent magnet is used to fix the substrate and the holder, the substrate and the holder can be readily separated by generating a magnetic field opposite to that generated by the permanent magnet. It is preferable to install a magnetic shielding to the substrate or the holder so as to surround the semiconductor device since malfunction of the semiconductor device may be caused by the permanent magnet.

If a handling head for attracting the semiconductor device to the holder via an air through-hole provided in the holder is employed when the semiconductor device is mounted on the substrate, no displacement of the semiconductor device against the holder is caused when the holder and the semiconductor device are mounted on the substrate.

Moreover, if an elastic body is embedded in the substrate beneath wirings, excessive pushing force between terminals or electrodes on the semiconductor device and wirings on the substrate can be prevented. The elastic body may be formed either rubber-like substance or pins with elasticity. If the pins are projected from the bottom of the substrate, they can also be used as plugs for sockets.

If an insulating sheet is interposed between the substrate and wirings formed on the substrate, the substrate may be formed of conductor or metal magnetic substance, and therefore embedding of magnetic pieces into the substance or the holder is negligible, and also the substrate can be utilized as a electric shielding.

If such a configuration is adopted that finally the holder is fixed to the substrate mechanically, magnetic force may be utilized according to the holder to push the semiconductor device to the substrate temporarily. If a latch mechanism is used as a mechanical fixing configuration, the magnetic force can be removed after the holder and the substrate are fixed by the latch mechanism since the fixing is stabilized by the latch mechanism.

DETAILED DESCRIPTION OF THE PREFERRED EMBODIMENTS

Preferred embodiments of the present invention will now be described hereinafter with reference to the accompanying drawings.

(First Embodiment)

The first embodiment of the present invention will be described with reference to FIGS. 5A, 5B, 6, 7A, 7B, 8A, 6B, 9, 10 11A, and 11B hereinbelow.

Figure 5A:
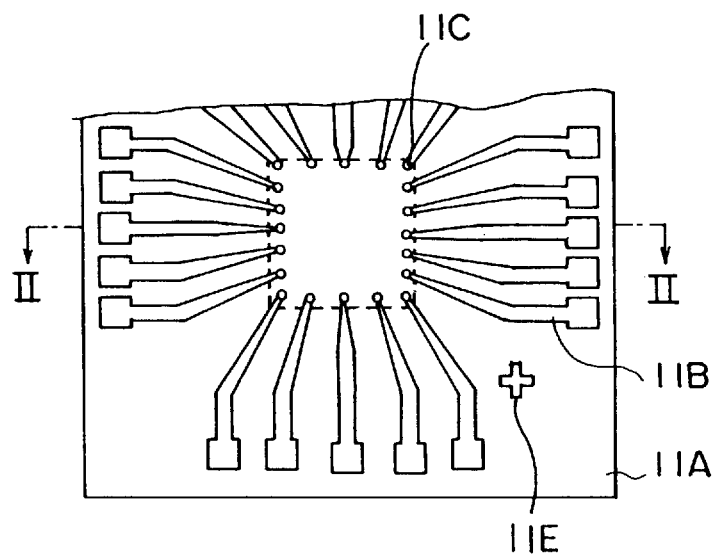
FIG. 5A is a plane view showing the test carrier for the semiconductor integrated circuit device according to the first embodiment of the present invention.
Figure 5B:
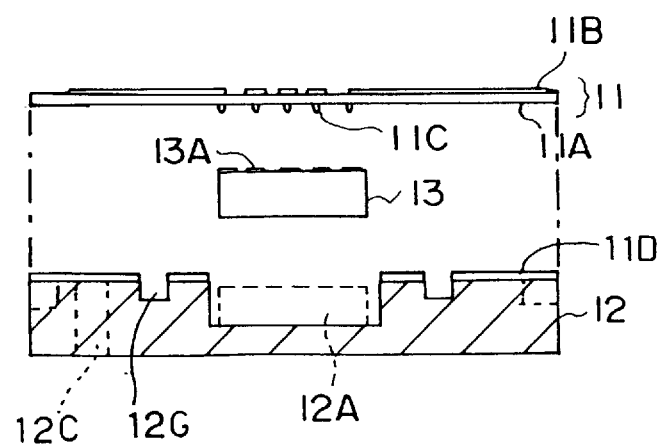
FIG. 5B is a cross-sectional view showing the displacement relation between the test carrier for the semiconductor integrated circuit device according to the first embodiment of the present invention and the semiconductor chip, taken along the II—II line in FIG. 3A.

As shown in FIGS. 5A and 5B, a test carrier for a semiconductor integrated circuit device according to the first embodiment includes a sheet 11 having contact electrodes and a substrate 12.

The sheet 11 for covering the substrate 12 comprises a film 11A made of a flexible material such as polyimide and having a thickness of about 0.01 to 0.05 mm, a plurality of contact pads 11C formed on one surface of the film 11A, and a plurality of conductive wiring patterns 11B formed on one or the other surface of the film 11A and connected to the contact pads 11C. The plurality of contact pads 11C are so formed that they can correspondingly contact the plurality of electrodes 13A formed on a semiconductor chip 13 which is mounted on the substrate 12. Also, the plurality of wiring patterns 11B formed on the film 11A are formed so as to have patterns to be contacted to a plurality of terminals of a socket of the testing device described later.

The substrate 12 is made of epoxy resin or the like. A concave pocket 12A, in which the semiconductor chip 13 is disposed, is formed in the central portion of the substrate 12.

In the next, a method of holding the semiconductor chip as an object to be tested in the test carrier will be explained.

Figure 6:
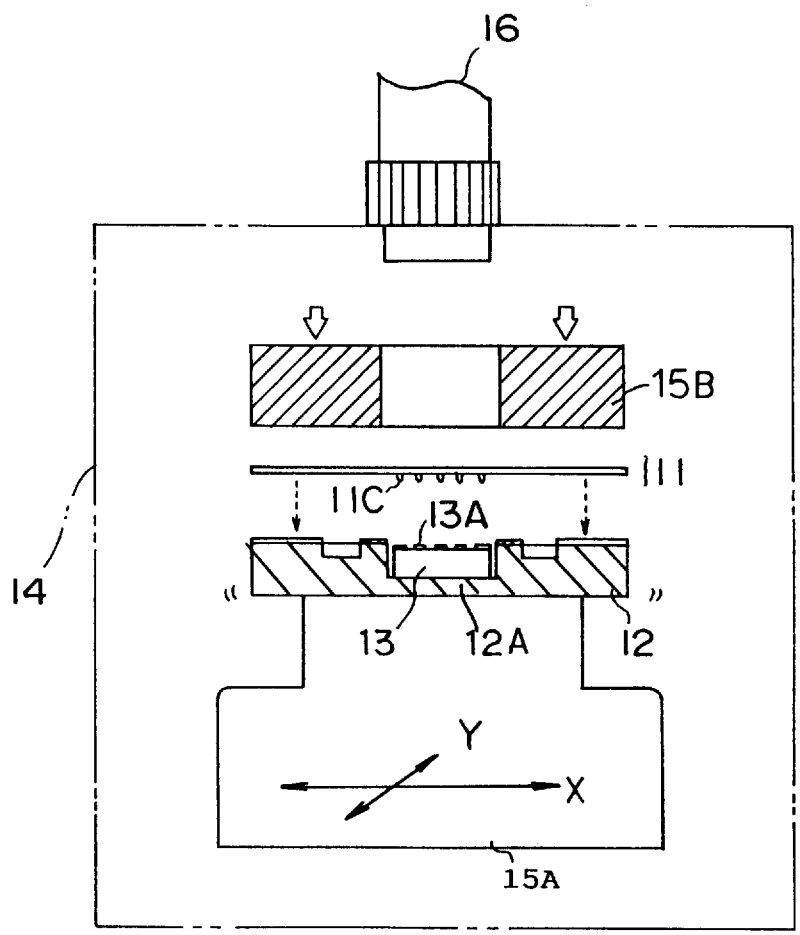
FIG. 6 is a cross-sectional view showing schematically a method of incorporating the semiconductor chip into the test carrier for the semiconductor integrated circuit device according to the first embodiment of the present invention.

First, as shown in FIG. 6, while the semiconductor chip 13 is displaced in the pocket 12A of the substrate 12, the substrate 12 is placed in a vacuum furnace 14 to be mounted on an XY stage 15A. Then the sheet 11 is also carried into the vacuum furnace 14 and is then fixed therein by a fixing device (not shown). In this case, as shown in FIG. 5B, an adhesive 11D is applied to at least either the upper surface of the substrate 12 and the lower surface of the film 11A. In this case, the semiconductor chip 13 is placed in the pocket 12A so that the electrode 13 A face to the sheet 11.

Subsequently, with confirming location displacements between the electrodes 13A of the semiconductor chip 13 and the contact pads 11C of the sheet 11 by mean of a microscope 16, the location of the semiconductor chip 13 is adjusted by moving the XY stage 15A so that the contact pads 11C are displaced right over the electrodes 13A. In addition, after the sheet 11 is moved toward the substrate 12, the contact pads contact the electrodes 13A, so as to again finely adjust the location of the XY stage 15A. While reducing a pressure in the vacuum furnace 14 or after an operation for reducing the pressure is effected, this alignment is conducted.

Figure 7A:
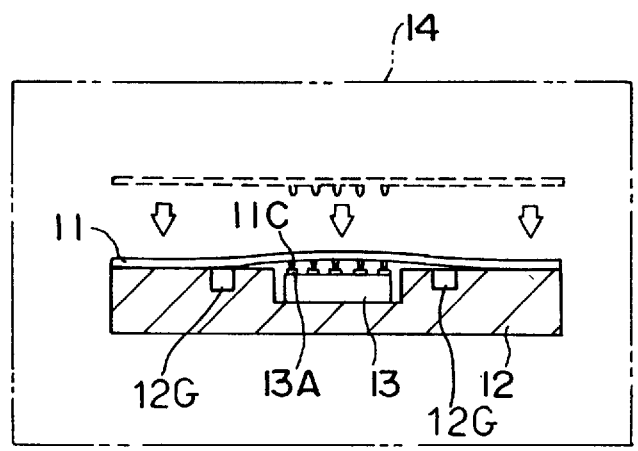
FIG. 7A is a cross-sectional view showing the situation where the semiconductor chip is incorporated into the test carrier for the semiconductor integrated circuit device according to the first embodiment of the present invention in the reduced pressure atmosphere.

As shown in FIG. 7A, when peripheral areas of the contact pads 11C of the sheet 11 are strongly pushed to the substrate 12 by a press device 15B in reduced pressure, the lower surface of the sheet 11 is secured against the upper surface of the substrate 12 by an adhesive 11D. The adhesive 11D is made of epoxy resin or the like. When an inert gas such as nitrogen or argon is introduced into the vacuum furnace 14 in reduced pressure, oxygen is not included at all in the vacuum furnace 14, otherwise an amount of oxygen is reduced in the vacuum furnace 14. Thereby, although the amount of the inert gas is very little, such inert gas is introduced into clearances formed between the substrate 12 and the sheet 11, for example, inner spaces of the pocket 12A and a ring-like groove 12G formed around the pocket 12A. The inert gas is used to reduce the amount of oxygen.

Figure 7B:
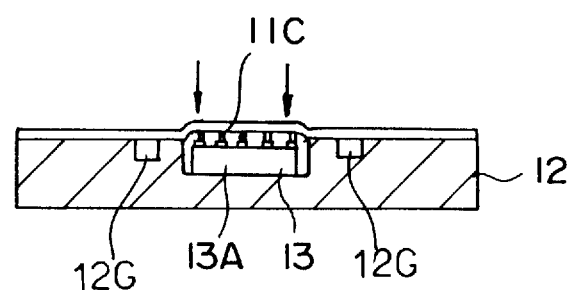
FIG. 7B is a cross-sectional view showing the situation where the test carrier according to the first embodiment into which the semiconductor chip is incorporated is exposed into the air.

Next, as shown in FIG. 7B, the test carrier on which the semiconductor chip 13 is mounted is carried out from the vacuum furnace 14 to put the chip 13 in normal pressure, the sheet 11 is pulled to the chip 13 and the substrate 12 due to pressure difference between the pressure in the space formed between the sheet 11 and the substrate 12 and the atmospheric pressure. As a result, the contact pads 11C is pressed toward the electrodes 13A by uniform force. In this case, the adhesive interposed between the sheet 11 and the substrate 12 also serves as a sealing material.

Figure 8A:
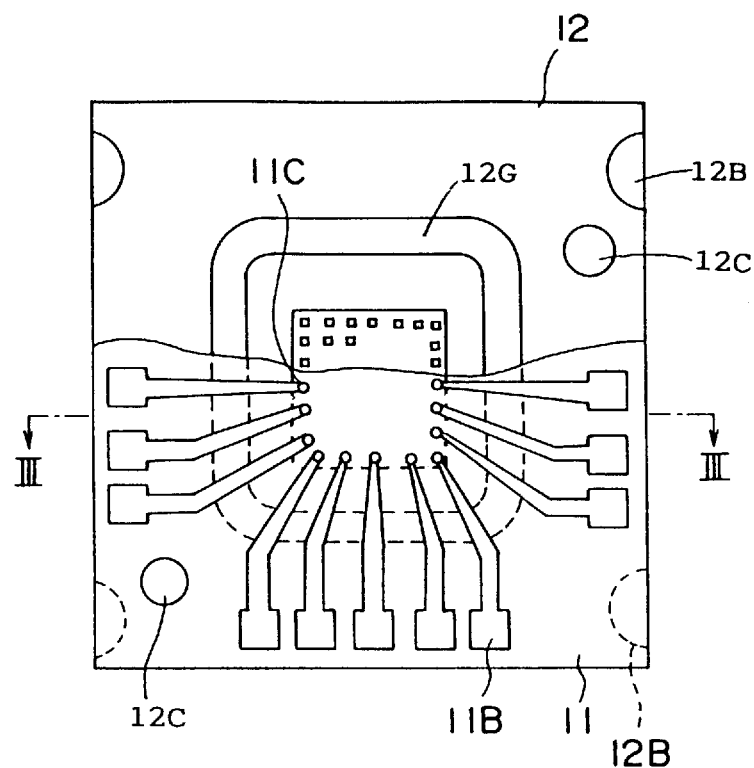
FIG. 8A is a plane view showing an example where the sheet suction groove and the notched groove are formed on the test carrier according to the first embodiment of the present invention.
Figure 8B:
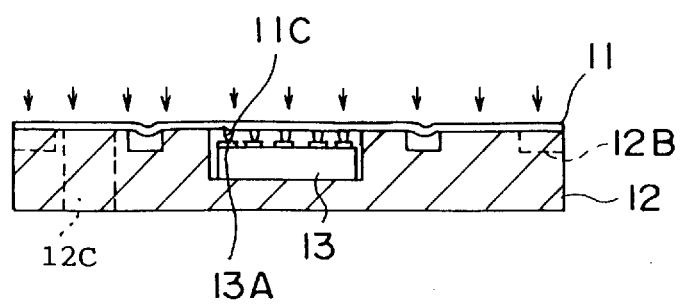
FIG. 8B is a cross-sectional view showing a sectional shape taken along the III—III line in FIG. 8A.

According to the above operations, as shown in FIGS. 8A and 8B, the contact pads 11C of the sheet 11 and the electrodes 13A of the semiconductor chip 13 are firmly and strongly connected together. Fitting operations of the semiconductor chip has been completed by the above steps.

In this test carrier, since the contact pads 11C of the sheet 11 and the electrodes 13A of the semiconductor chip 13 are firmly connected by appropriate contact force and then fixed, their contacts are not easily disconnected because of vibrations during the B.I test, shocks during transportation or the like.

Since it is not necessary to use a probe pin that is used in the test for the semiconductor integrated circuit in the wafer state, the cost of the test can be reduced. In addition, if the electrodes 13A of the semiconductor chip 13 are formed in high density, the test can be effected to meet the actual circumstance of the semiconductor chip since the contact pads 11C can also be correspondingly formed easily in high density.

Figure 9:
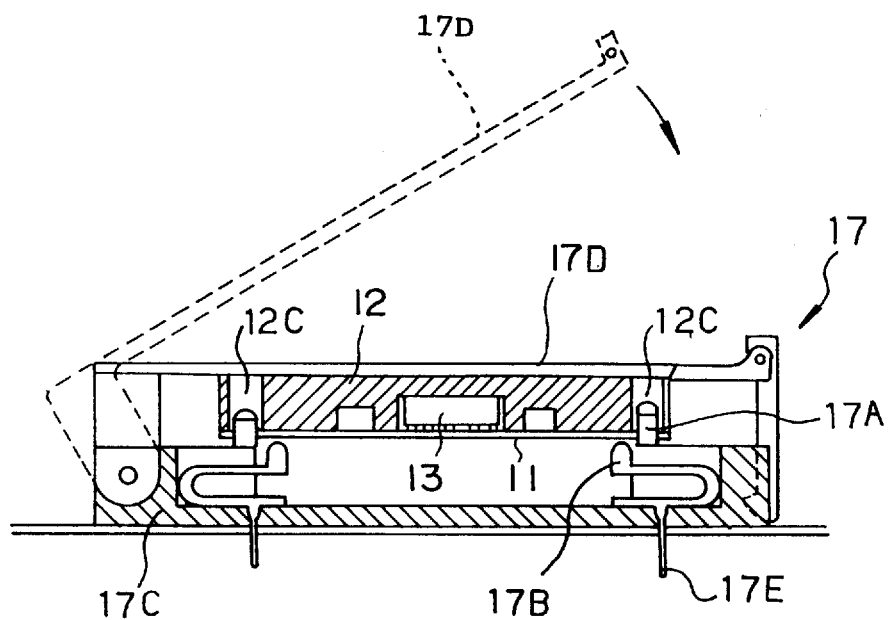
FIG. 9 is a cross-sectional view showing the situation where the test carrier according to the first embodiment of the present invention into which the semiconductor chip is incorporated is fitted into the socket for the B.I test.

Then, as shown in FIG. 9, the B.I test is performed after the test carrier described above is fitted into an IC socket 17 of the heating furnace for the B.I test, which is used for the packaged semiconductor chip.

The IC socket 17 is provided with supporting pins 17A, electrode pins 17B for contacting to connecting wiring patterns 11B of the sheet 11, a socket main body 17C, and a cover 17D. The supporting pins 17A are inserted into pin holes 12C formed in the substrate 12 of the test carrier. Each of the electrode pins 17B is formed so as to have a spring force under the condition where the test carrier is pressed by the cover 17D. The pin 17B has a terminal 17E connected to the test circuit not shown.

While keeping the heating furnace for the B.I test at temperature of about 125° C. for a constant time (for example, 48 hours or 96 hours), the B.I test is conducted by applying signals to the semiconductor chip 13 via the electrode pins 17B, the wiring patterns 11B, the contact pads 11C and the electrodes 13A. Thus changes in electric characteristics of the semiconductor chip is examined during heating.

After completing the B.I test, the test carrier is removed from the IC socket 17. Then the semiconductor chip 13 is taken out by stripping off the sheet 11 from the substrate 12 of the test carrier.

The semiconductor chip 13, characteristic changes of which is confirmed and allowed by the B.I test, is forwarded as the product.

Figure 10:
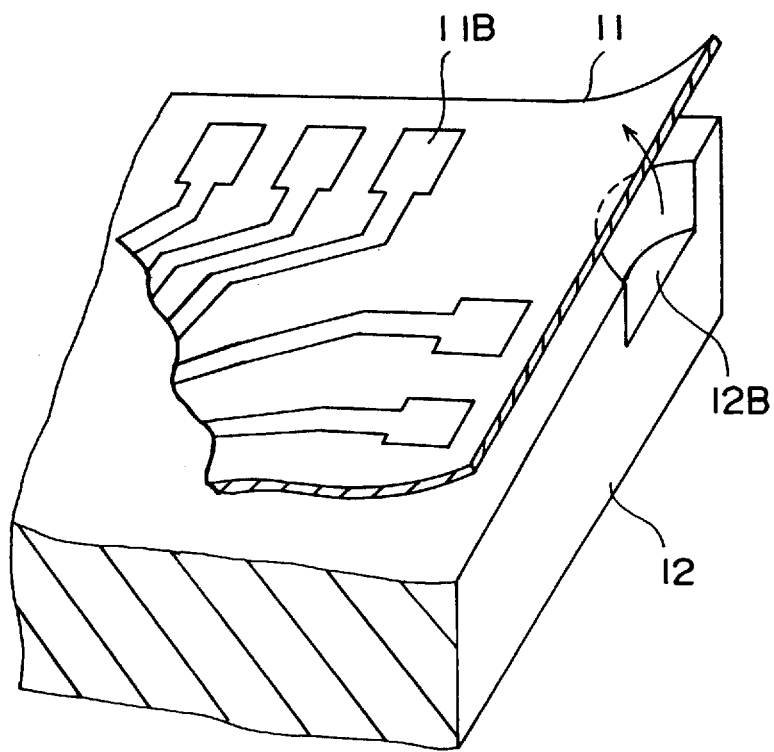
FIG. 10 is a perspective view showing the situation where the sheet is stripped off from the test carrier according to the first embodiment of the present invention.

Since, in this B.I test, the oxygen is scarcely included in the space between the sheet and the substrate 12, the electrodes 13A of the semiconductor chip 13 are never oxidized by heating. Further, if the adhesive 11D for contacting the sheet 11 to the substrate 12 is formed with a material which reduces its adhesive property when it is heated, the sheet can be easily stripped off. In addition, since, as shown in FIGS. 8A and 8B, notches 12B are formed on part of an edge of the substrate 12, the sheet 11 can be readily stripped off by inserting the tweezers or the finger nail into the notched portion 12B, as shown in FIG. 10, after completing the B.I test.

Figure 11A:
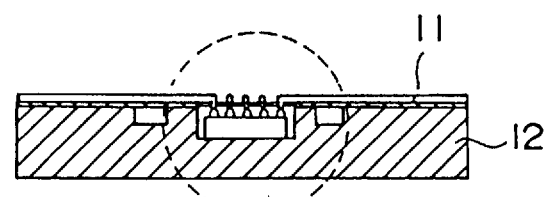
FIGS. 11A and 11B are cross-sectional views showing the situation where the semiconductor chip having hemisphere-like electrodes is incorporated into the test carrier according to the first embodiment of the present invention.
Figure 11B:
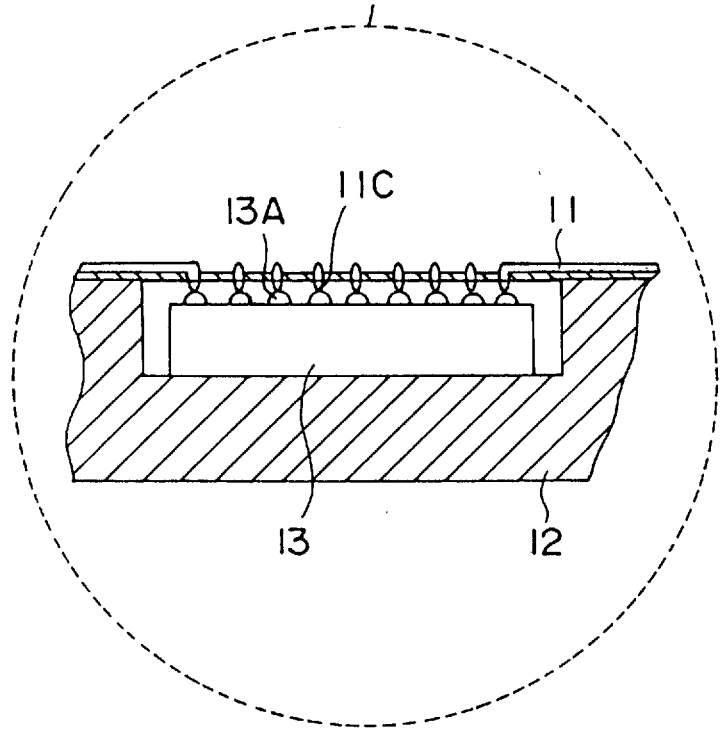

In the meanwhile, as shown in FIGS. 11A and 11B, according to the test carrier of this embodiment, in case an area bump chip having hemispherical electrodes 13A is tested, the hemispherical electrodes 13A and the contact pads 11C are easily aligned so as to contact them. In addition, since they are contacted to each other by pressing one to the other, they are not easily disconnected. Therefore, the test carrier can be used for a test with vibrations.

Moreover, since the rear surface of the semiconductor chip 13 and the bottom surface of the pocket 12A formed on the substrate 12 are tightly contacted, a heating temperature of the chip under test can be readily controlled by forming the substrate 12 with a high heat radiating material such as aluminum, for example.

The reliability of the test can be therefore improved.

But, at that time, it is preferable to cover the inner surface of the pocket 12A and the bottom surface of the substrate 12 with an insulating film since the aluminum is a conductive material.

Furthermore, since, upon assembling the chip, the interior of the vacuum furnace 14 is made in vacuum state or is filled with the low pressure inert gas, especially the oxygen is never mixed, the oxygen scarcely remains in the pocket 12A for mounting the chip thereon. Thus, even if the chip is heated by the B.I test at high temperature for a long while, the deterioration of the contact electrodes 13A formed on the chip 13 because of oxidization can be prevented.

As shown in FIG. 5A, in case the electrodes 13A of the semiconductor chip 13 and the contact pads 11C of the sheet 11 are aligned automatically with each other, a mechanism is required to determine whether alignment marks 11E, which are formed on both the sheet 11 and the substrate 12, coincide with each other. However, it is important that the size of the mechanism must be decided so that the semiconductor chip 13 cannot slide in the pocket 12A.

(Second Embodiment)

The first embodiment of the present invention will be described with reference to FIGS. 12A, 12B, 13A, 13B, 14A and 14B hereinbelow. In these Figures, the same references as used for the first embodiment will be used to denote the identical components, so that their redundant description of matters described in the first embodiment will be omitted.

Figure 12A:
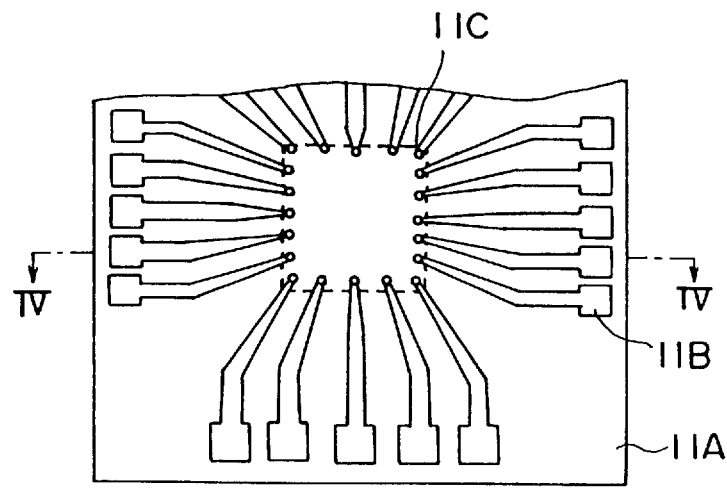
FIG. 12A is a plane view showing the test carrier for the semiconductor integrated circuit device according to the second embodiment of the present invention.
Figure 12B:
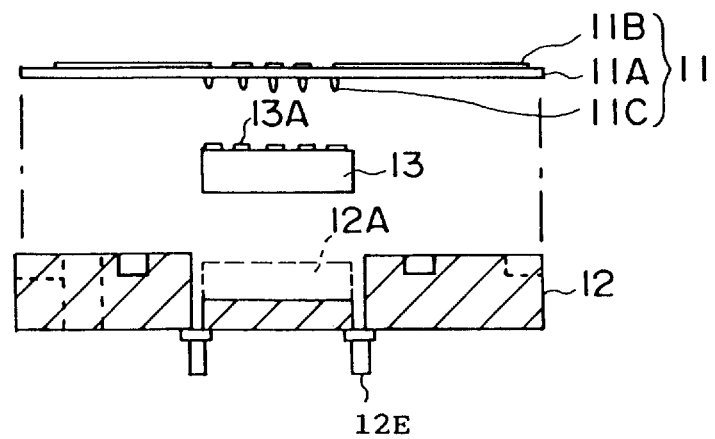
FIG. 12B is a cross-sectional view showing the displacement relation between the test carrier for the semiconductor integrated circuit device according to the second embodiment of the present invention and the semiconductor chip, taken along the IV—IV line in FIG. 12A.

At first, a test carrier for the semiconductor integrated circuit device according to the second embodiment will be explained with reference to FIGS. 12A and 12B.

Like the first embodiment, the test carrier for the semiconductor integrated circuit device according to the second embodiment comprises a sheet 11 and a case 12.

The sheet 11 for covering the substrate 12 comprises a film 11A made of polyimide having a thickness of about 0.01 to 0.05 mm, a plurality of contact pads 11C formed on one surface of the film 11A, and a plurality of conductive wiring patterns 11B formed on the other surface of the film 11A and connected to the contact pads 11C. The plurality of contact pads 11C are so formed that they can contact correspondingly to the plurality of electrodes 13A formed on a semiconductor chip 13 which is mounted on the substrate 12.

The substrate 12 is formed of epoxy resin or the like. A concave pocket 12A in which the semiconductor chip 13 is disposed is formed in the central portion of the substrate 12. A coupler 12E serving as a switching valve is provided under the pocket 12. The second embodiment is different from the first embodiment in that such coupler 12E is provided. The coupler 12E is connected to the pocket 12A. Therefore, in the situation where the semiconductor chip 13 is housed in the pocket 12, the coupler 12E serves as an exhaust valve to exhaust the air from the space formed between the substrate 12 and the sheet 11, and to thus reduce the pressure therein.

A method of displacing the semiconductor chip 13 as a tested object into such test carrier will be explained hereinbelow.

Figure 1:
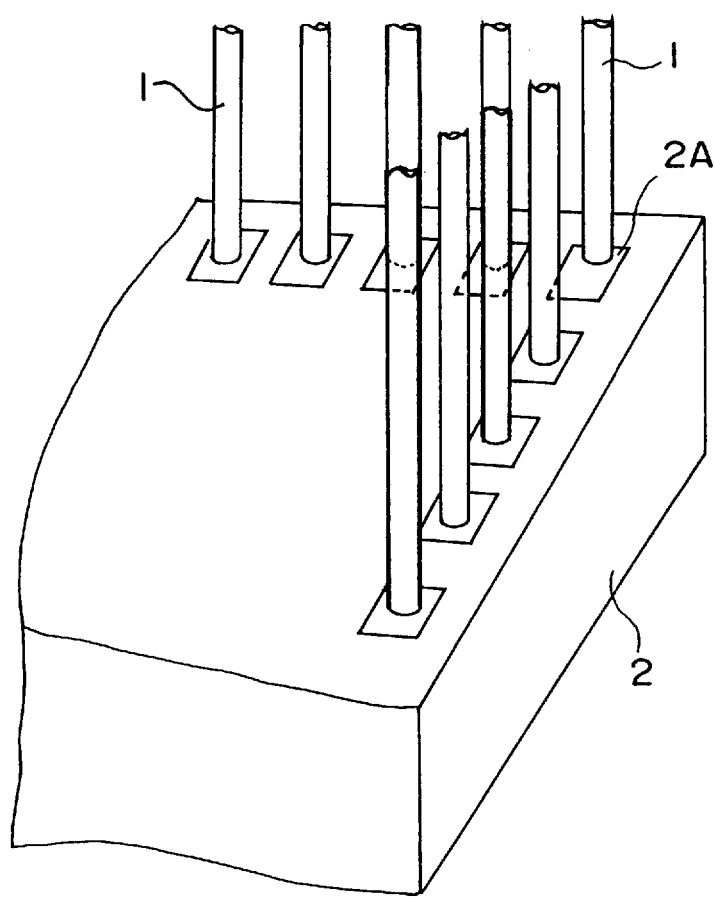
FIG. 1 is a perspective view showing the situation where the circuit test for the semiconductor chip is effected using the conventional test apparatus.
Figure 2A:
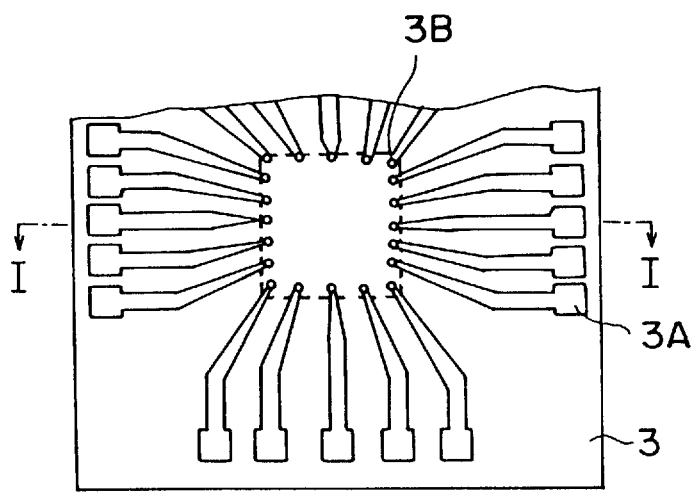
FIG. 2A is a plane view showing the situation where the circuit test for the semiconductor chip is effected using the conventional film.
Figure 2B:
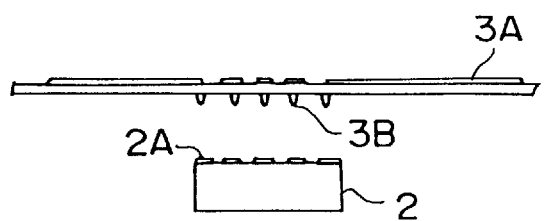
FIG. 2B is a cross-sectional view showing a fitting state of the semiconductor chip to the film, taken along the I—I line in FIG. 2A.
Figure 3A:
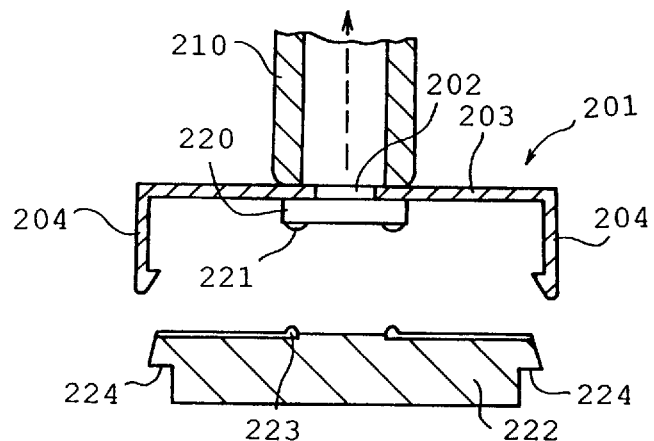
FIG. 3 is sectional views showing a first example of the conventional testing carrier.
Figure 3B:
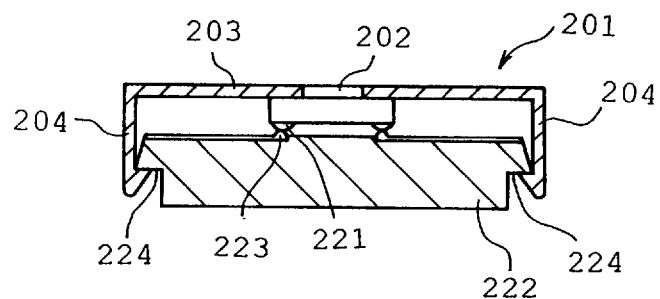
Figure 4:
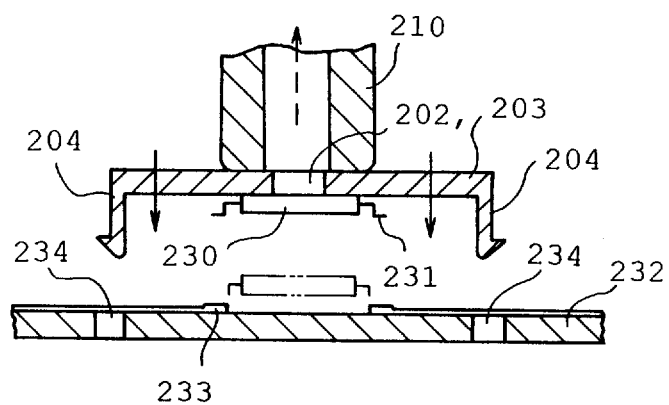
FIG. 4 is a sectional view showing a second example of the conventional testing carrier.
Figure 13A:
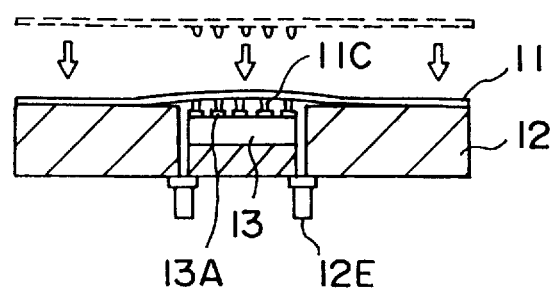
FIG. 13A is a cross-sectional view showing the situation where the semiconductor chip is incorporated into the test carrier for the semiconductor integrated circuit device according to the second embodiment of the present invention in the reduced pressure atmosphere.

First, the semiconductor chip 13 is displaced in the pocket 12A of the substrate 12. Then, as shown in FIG. 13A, the electrodes 13A of the semiconductor chip 13 and the contact pads 11C of the sheet 11 are contacted by the same operations as in the first embodiment using the vacuum furnace 14 shown in FIG. 4. Furthermore, as in the first embodiment, the sheet 11 and the substrate 12 are bonded by the adhesive. The heating furnace 14 is kept at normal pressure during these operations. In this case, the coupler 12E is held in open state.

Figure 13B:
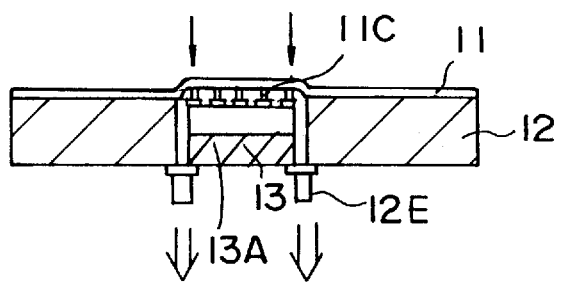
FIG. 13B is a cross-sectional view showing the situation where the test carrier according to the second embodiment into which the semiconductor chip is incorporated is exposed into the air.

Thereafter, as shown in FIG. 13B, the coupler 12E is connected to a suction apparatus (not shown) while it is opened. Subsequently, the pressure in the pocket 12A is reduced lower than the normal pressure by exhausting the air in the pocket 12A by the suction apparatus. After this, the pressure in the space formed between the sheet 11 and the substrate 12, for example, the pressure in the pocket 12, is reduced by closing the coupler 12E. After closing the coupler 12E, the suction apparatus is removed.

Figure 14A:
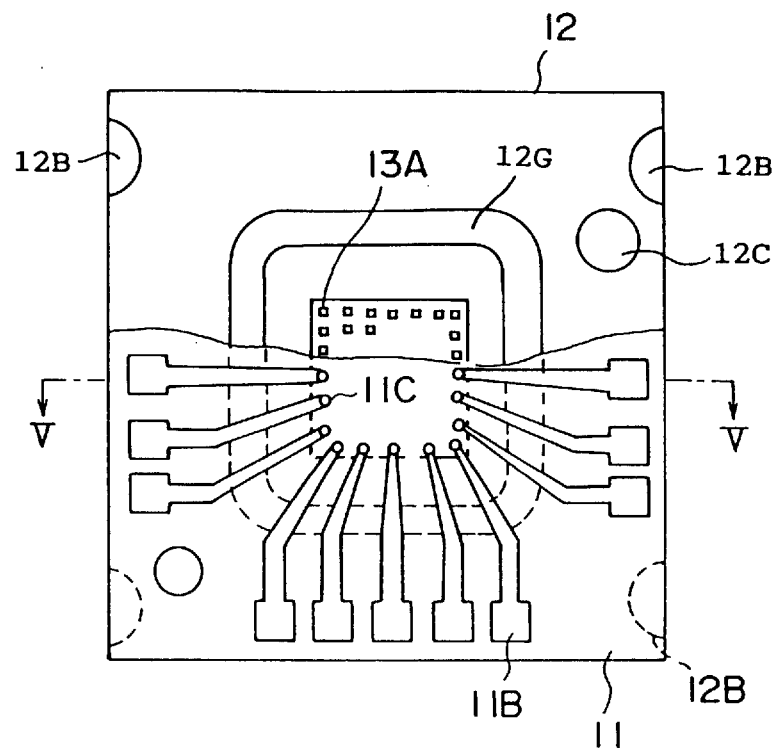
FIG. 14A is a plane view showing an example where the sheet suction groove and the notched groove are formed on the test carrier according to the second embodiment of the present invention.
Figure 14B:
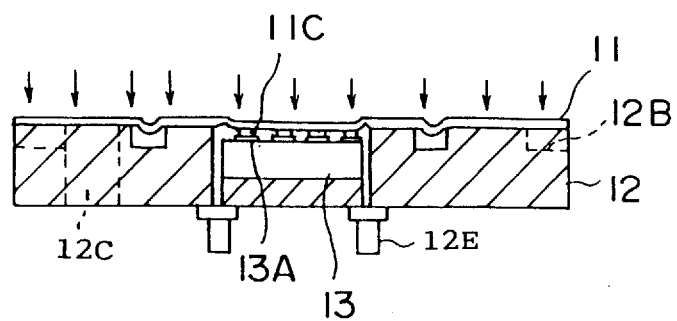
FIG. 14B is a cross-sectional view showing a sectional shape taken along the V—V line in FIG. 14A.

With the above, as shown in FIGS. 14A and 14B, after the operation of installing the semiconductor chip into the test carrier is completed, and thereafter the test carrier is fitted into the IC socket 17, as shown in FIG. 7, the B.I test is effected like the first embodiment.

According to the second embodiment, not only the same advantages as obtained in the first embodiment can be achieved, but also it is not necessary to fit the semiconductor chip in reduced pressure or in vacuum atmosphere upon assembling the chip. Thus the throughput can be improved because the time used for reducing the pressure of whole interior of the vacuum furnace is not required. In addition, exhausting an interior of the pocket 12E via the coupler 12E can be done by a simple suction apparatus such as an electric cleaner in a short period of time.

Accordingly, in fact, it can be formed simply and cheaply without requiring a large equipment in size such as the vacuum furnace.

(Third Embodiment)

The third embodiment of the present invention will be described with reference to FIG. 15 hereinbelow. In these Figures, the same references as used for the first embodiment will be used to denote the identical components, so that their redundant description of matters described in the first and second embodiments will be omitted.

Figure 15:
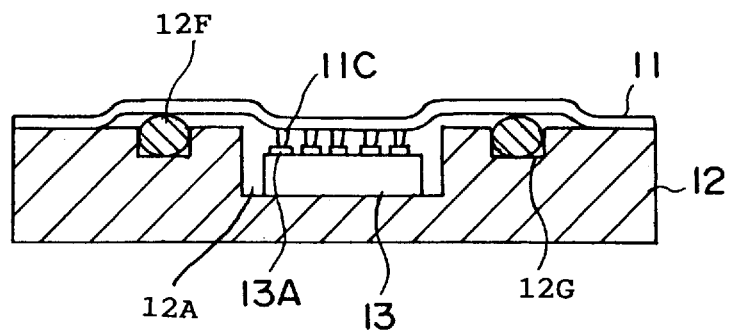
FIG. 15 is a cross-sectional view showing the test carrier for the semiconductor integrated circuit device according to the third embodiment of the present invention.

As shown in FIG. 15, like the first embodiment, the test carrier for the semiconductor integrated circuit device according to the third embodiment comprises a sheet 11 and a substrate 12. However, the third embodiment is different from the first embodiment in that an O ring 12F is embedded into a ring groove 12G surrounding a pocket 12A of the substrate 12 so that the sheet 11 and the O ring 12F are hermetically contacted. The O ring 12F is formed of an elastic material such as rubber, resin etc.

Since the O ring 12E is interposed between the sheet 11 and the substrate 12, a sealing property between them can be increased more than that of the test carrier in the first embodiment. As a result, an alignment displacement between them becomes more difficult to be occurred due to vibrations during the test or shocks during transportation.

(Fourth Embodiment)

The fourth embodiment of the present invention will be described with reference to FIGS. 16 and 17 hereinbelow.

The test carrier for the semiconductor integrated circuit according to the fourth embodiment is different significantly from the embodiments described above in that, in place of using the substrate having the pocket thereon as the substrate on which a semiconductor chip 23 as a tested object is mounted, the substrate made of thin plate-like member of polyimide, epoxy resin etc. is used.

Figure 16:
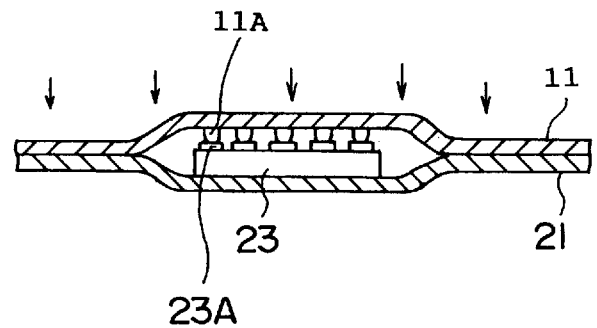
FIG. 16 is a cross-sectional view showing the test carrier for the semiconductor integrated circuit device according to the fourth embodiment of the present invention.

The test carrier made of the film substrate 21 and the sheet 11 has a structure shown in FIG. 16, for example. The sheet 11 has substantially the same structure as those of the first to third embodiments. The substrate 21 is formed by the same material as the film 11A forming the sheet 11, that is, by the polyimide film having a thickness of about 0.01 to 0.05 mm. Contact pads are formed on the lower surface of the substrate 21 and wiring patterns are formed on the upper surface of the substrate 21.

When mounting the semiconductor chip 23 on the test carrier, the following assembling operations are performed.

First, the semiconductor chip 23 to be tested is put on the film substrate 21 and fixed there. Then the chip 23 is placed in the vacuum furnace 14 shown in FIG. 6, and, as in the first embodiment, the contact electrodes 23A of the semiconductor chip 23 and the contact pads 11A are aligned. The substrate film 21 and the contact sheet 22 are thereafter bonded by the adhesive etc. in reduced pressure.

After this, the test carrier is taken out from the vacuum furnace 16 into normal pressure. At this time, as shown in FIG. 14, the test carrier where the contact electrodes 23A and the contact pads 11A are contacted is completed.

Figure 17:
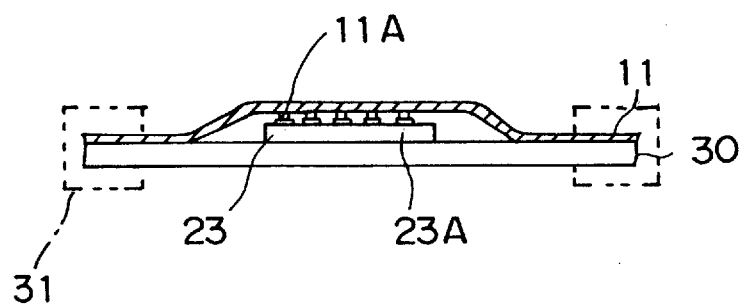
FIG. 17 is a cross-sectional view showing the test carrier for the semiconductor integrated circuit device, in which its lower sheet is formed of hard material, according to the fourth embodiment of the present invention.

Note that, instead of the flexible film substrate 11 shown in FIG. 16, a film substrate 30 made of a rigid material such as polyimide, epoxy resin etc. can be used, as shown in FIG. 17.

According to the test carrier according to the fourth embodiment shown in FIGS. 16 and 17, since it is not required to use the case having the pocket for holding the semiconductor chip, unlike the first to third embodiments, the test carrier can be readily formed and also the substrate can be easily formed. Thus the cost thereof is reduced.

In the fourth embodiment described above, it should be noted that, although the sheet is secured against the substrate by the adhesive in the above four embodiments, a frame member 31 made of a rubber etc. can be formed so as to surround and cover circumferences of the sheet 11 and the substrate 30 in reduced pressure as shown by a dashed line in FIG. 17.

(Fifth embodiment)

Figure 18A:
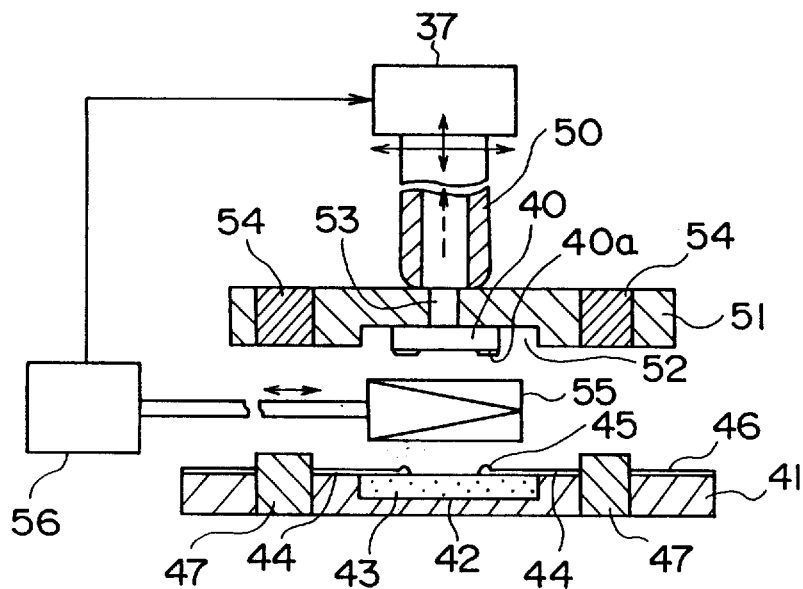
FIGS. 18A and 18B are sectional views showing a holding apparatus of a semiconductor device according to a fifth embodiment of the present invention.
Figure 18B:
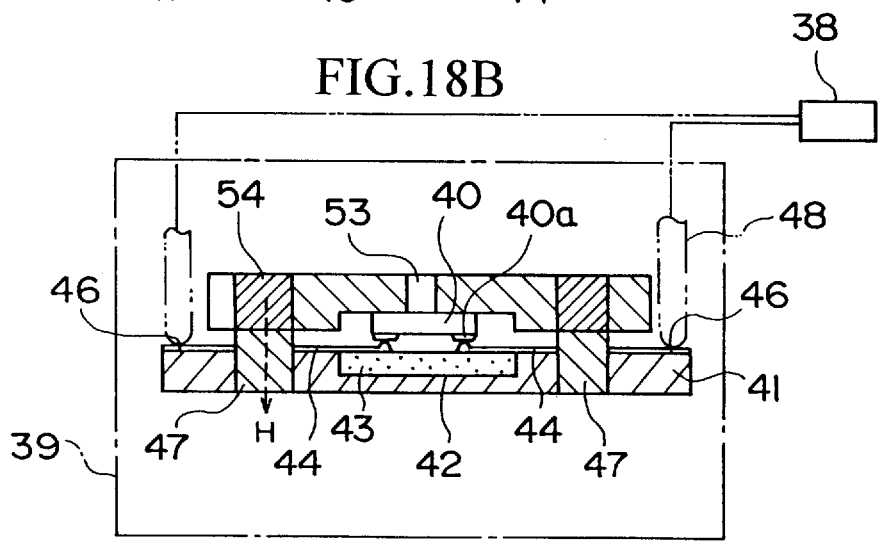

FIGS. 18A and 18B showing how to fit a semiconductor device into a testing carrier according to a fifth embodiment of the present invention.

As shown in FIGS. 18A and 18B, the testing carrier comprises a testing wiring substrate 41 and a holding substrate 51, both putting a chip on which a semiconductor integrated circuit is formed (referred to as "bare chip" hereinafter) therebetween. One side of the testing wiring substrate 41 is formed longer by almost 5 to 10 mm than that of the holding substrate 51. The testing wiring substrate 41 and the holding substrate 51 are formed of insulating non-magnetic substance such as $Al_2O_3$ or resin (PES, PEI, or glass containing epoxy resin).

A concave portion 42 is formed in a center area on a top surface of the testing wiring substrate 41, and an elastic body 43 made of rubber is embedded in the concave portion 42. On the top surface of the testing wiring substrate 41, with increasing their pitches and widths, a plurality of testing wiring patterns 44 are extended from peripheral areas of a central portion of the elastic body 43 to edges of the substrate. Contact terminals 45 are formed on respective inner edge portions of the testing wiring patterns 44. In addition, outer terminals 46 are formed on outer edge portions of the patterns 44. The contact terminals 45 are arranged to coincide with electrodes 40a of the bare chip 40.

The plurality of testing wiring patterns 44 are arranged so as to spread in a radial fashion.

At least two magnetic pieces 47 are embedded around the elastic body 43 on the testing wiring substrate 41. These magnetic pieces 47 are formed of iron, iron alloy, cobalt, cobalt alloy, or the like, and also formed in the circumstance where it is not magnetized not to scarcely generate a magnetic field.

In an area of the holding substrate 51 facing to the elastic body 43 on the testing wiring substrate 41, a concave portion 52 are formed to hold the bare chip 40. An air through-hole 53 having a diameter of about 3 mm is formed in the center of the concave portion 52 to penetrate the holding substrate 51. At locations of the holding substrate 51 opposing to the magnetic pieces 47 in the testing wiring substrate 41, magnets (permanent magnets) 54 formed of cobalt, cobalt alloy, chromium, or chromium alloy, for example, are embedded.

Figure 19A:
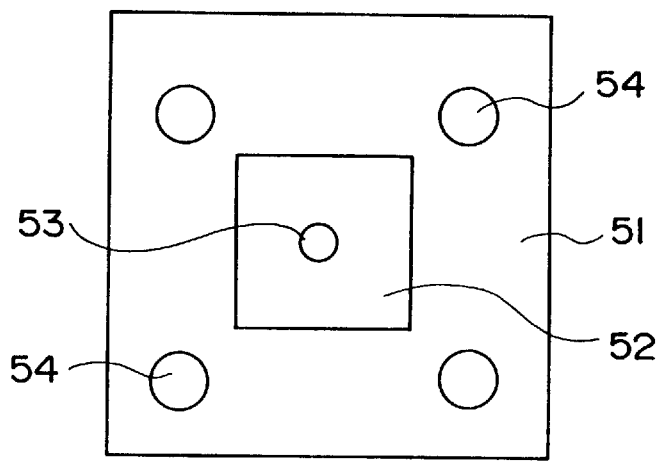
FIG. 19A is a bottom view showing a holding substrate of the holding apparatus of the semiconductor device according to the fifth embodiment of the present invention.
Figure 19B:
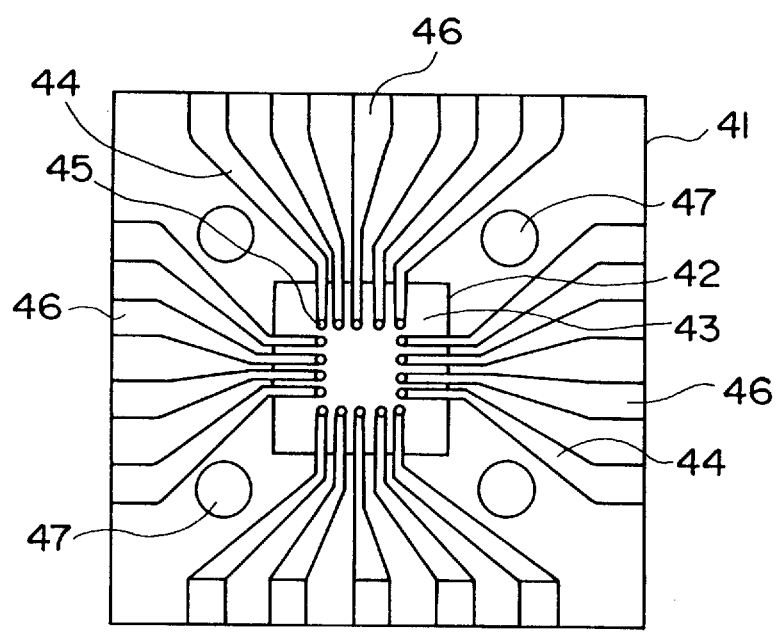
FIG. 19B is a top view showing a testing wiring substrate of the holding apparatus in FIG. 19A.

An under surface of the holding substrate 51 has a shape shown in FIG. 19A, for instance, and a top surface of the testing wiring substrate 41 has a shape shown in FIG. 19B, for instance.

In FIGS. 18A and 18B, a reference 50 denotes a hollow handling head which is so formed that it can suck outer air from a top end, which is larger than the air through-hole 53 of the holding substrate 51, and that it can be moved by a driving mechanism 37 in the vertical and lateral directions.

The bare chip 40 is fitted to the testing wiring substrate 41 according to following procedures.

First the bare chip 40 is placed on the concave portion 52 of the holding substrate 51 so as to direct the electrode 40a on the bare chip 40 outwardly. The holding substrate 51 is attracted by the handling head 50 to be held, and at the same time the bare chip 40 is attracted through the air through-hole 53 to be fixed on the holding substrate 51.

Subsequently, by moving the handling head 50, the holding substrate 51 is opposed over the testing wiring substrate 41 at a distance.

In turn, a location recognizing camera 55 which can recognize upper and lower images is inserted between the testing wiring substrate 41 and the holding substrate 51 to pick up images of all contact terminals 45 on the testing wiring substrate 41 and all electrodes 40a on the bare chip 40.

Data obtained from the location recognizing camera 55 are fetched into an image processing apparatus 56, and then locations of the contact terminals 45 on the testing wiring substrate 41 and the electrodes 40a on the bare chip 40 are respectively converted into coordinate data. If the image processing apparatus 56 has determined that the contact terminals 45 and the electrodes 40a on the bare chip 40 are not opposed one by one, the driving mechanism 37 adjusts the location of the handling head 50 so as to oppose the contact terminals 45 and the electrodes 40a on the bare chip 40 correspondingly.

If the image processing apparatus 56 has determined that all contact terminals 45 and all electrodes 40a are opposed one by one, the handling head 50 is descended toward the top surface of the testing wiring substrate 41, and also the location recognizing camera 55 is removed between the testing wiring substrate 41 and the holding substrate 51 at appropriate timing. In addition, by further descending the handling head 50, finally the magnet 54 and the magnetic piece 47 are attracted by the magnetic field H. As a result, the holding substrate 51 can be fixed to the testing wiring substrate 41 firmly via the magnet 54 and the magnetic piece 47 to therefore contact the electrodes 40a on the bare chip 40 to the contact terminals 45 on the testing wiring substrate 41.

Meanwhile, unless the electrodes 40a and the contact terminals 45 are pushed by external force, they are displaced mutually immediately after the pull force, caused by the handling head 50, is released. For this reason, under the condition where the magnets 54 and the magnetic pieces 47 being contacted mutually, the contact terminals 45 must be pushed against the electrodes 40a on the bare chip 40 because of elasticity of the elastic body 43 in the testing wiring substrate 41.

In order to generate such a pushing force, it is required that the electrodes 40a on the bare chip 40 pushes the elastic body 43 downwardly. To satisfy this requirement, a sum of projection amounts of the electrodes 40a on the bare chip 40 and the contact terminals 45 from respective substrates 51, 41 must be designed smaller than a sum of projection amounts of the magnets 54 and the magnetic pieces 47 from respective substrates 51, 41. Besides, the attraction force between the magnets 54 and the magnetic pieces 47 must be designed larger than the elasticity of the elastic body 43. For purposes of example, since a total sum of the pushing force to be applied to 100 electrodes 40a on the bare chip 40 becomes 1 kg if the pushing force of 10 g per one electrode 40a is needed, the magnets 54 providing the magnetic force in excess of 1 kg must be embedded in the holding substrate 51.

The semiconductor device in the bare chip 40 mounted on the testing wiring substrate 41, as described above, is subjected to circuit performance test via a testing prove 48 which is contacted to outer terminals 46 of the testing wiring patterns 44.

In addition, since the testing wiring substrate 41 and the holding substrate 51 are tightly fixed via the magnets 54 and the magnetic pieces 47, they are in no way displaced until the circuit performance test is terminated after the handling head 50 is removed.

Figure 20:
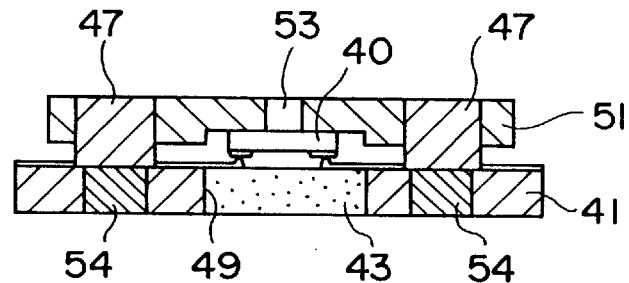
FIG. 20 is a sectional view showing a configuration in which positions of a magnet and a magnetic piece in a testing carrier are replaced with each other in the fifth embodiment of the present invention.

As shown in FIG. 20, even if the magnets 54 are embedded in the testing wiring substrate 41 while the magnetic pieces 47 are embedded in the holding substrate 51, similar effect can be achieved. The elastic body 43 may be buried in a through hole 49 provided in the testing wiring substrate 41, as shown in FIG. 20, in place of the concave portion 42 on the testing wiring substrate 41.

In the meanwhile, the bare chip 40 fitted in the testing carrier has to be taken out by separating the testing wiring substrate 41 from the holding substrate 51 after the circuit performance test such as BI test in the heating furnace by using the tester 38 has been completed. However, if the magnetic forces generated by the magnets 54 are excessively large, in some cases it takes a lot of time to separate the testing wiring substrate 41 from the holding substrate 51 or the bare chip 40 is damaged during such separating operation.

Figure 21A:
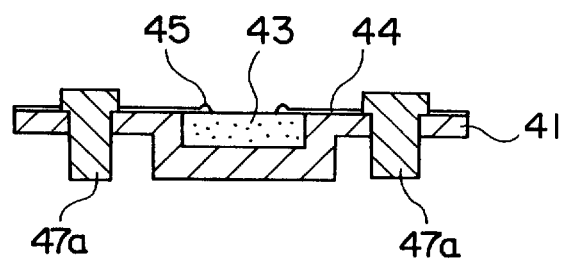
FIG. 21A is a sectional view showing the configuration wherein the magnetic piece in the testing carrier is projected out of a bottom surface the wiring substrate in the fifth embodiment of the present invention.

Hence, as shown in FIG. 21A, such a configuration may be adopted that magnetic pieces 47a being fitted to the testing wiring substrate 41 are projected downwardly. If the testing wiring substrate 41 is separated from the holding substrate 51, lower projections of the magnetic pieces 47a are inserted into respective magnetic field generating coils 57 and then electric current is supplied from a power source 58 to the magnetic field generating coils 57 to generate magnetic fields H1, as shown in FIG. 20B. If direction of the magnetic fields H1i is set to be opposite to that of the magnetic fields H generated by the magnets 54 in the holding substrate 51, the magnets 54 and the magnetic pieces 47a are readily separated due to repulsive powers acting between magnetic poles with the same polarity.

Figure 21B:
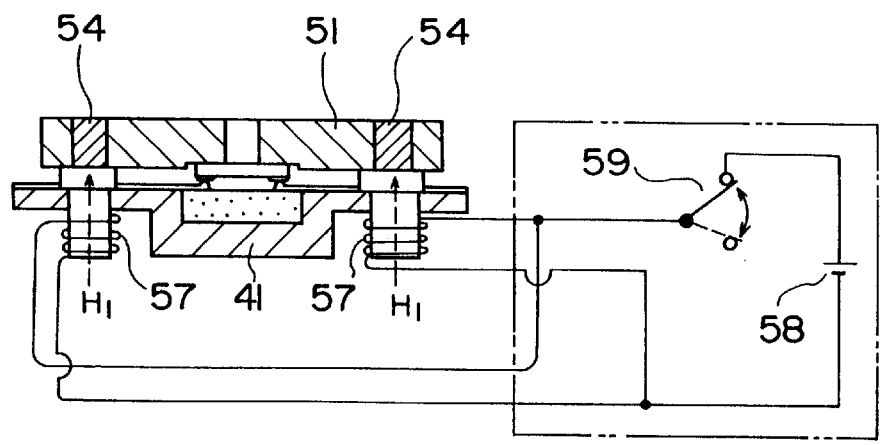
FIG. 21B is a sectional view showing the situation where a magnetic field is applied to the magnetic piece externally.

In FIG. 21B, a reference 59 denotes a switch for connecting the power source 58 to the magnetic field generating coils 57.

Like the above, if it is so designed that repulsive magnetic fields are generated in the magnetic pieces 47a only when attraction between the testing wiring substrate 41 and the holding substrate 51 is released, working efficiency for separating the substrates can be enhanced.

Figure 22:
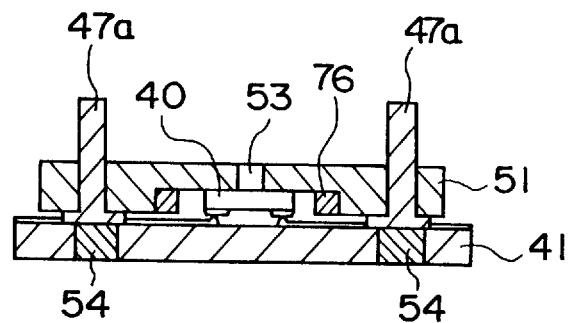
FIG. 22 is a sectional view showing the configuration wherein the magnetic piece in the testing carrier is projected out of an upper surface the wiring substrate in the fifth embodiment of the present invention.

As shown in FIG. 22, if the magnets 54 are provided in the testing wiring substrate 41, upper ends of the magnetic pieces 47b which are fitted to the holding substrate 51 may be projected from a top surface of the holding substrate 51, and then the upper ends may be inserted into the magnetic field generating coils 57 shown in FIG. 21B to generate repulsive magnetic fields when separating the substrates. To suppress the influence of external magnetic fields upon testing the semiconductor device in the bare chip 40, a magnetic shielding 76 may be provided along an inner periphery of the concave portion 52 of the holding substrate 51.

The above testing carriers may be used in the circuit performance test for not only the bare chip semiconductor device but also the packaged semiconductor device.

(Sixth embodiment)

Figure 23:
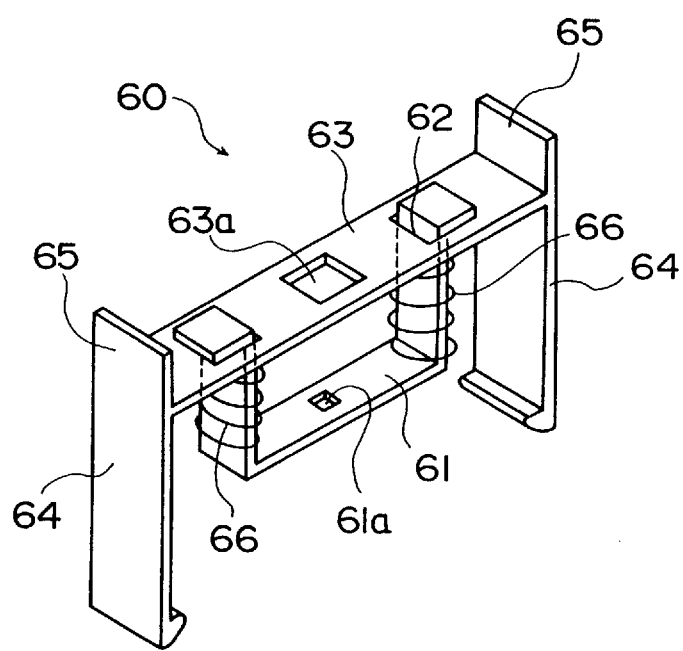
FIG. 23 is a perspective view showing a holder for use in a testing carrier according to a sixth embodiment of the present invention.

FIG. 23 shows a holder of holding the bare chip on the testing wiring substrate.

The holder 60 comprises an almost U-shaped pushing portion 61 formed of magnetic substance, and a stripe-shaped beam portion 63 having through holes 62 into which both arms of the pushing portion 61. Plate-like latch portions 64 formed of elastic substance extend from both sides of the beam portion 63 downwardly. Bottom ends of the latch portions 64 are bent to hold the testing wiring substrate 41A. Plate-like latch releasing portions 65 extend from both sides of the beam portion 63 upwardly.

The pushing portion 61 has a flat bottom surface which is parallel to the top surface of the testing wiring substrate 41A. A air through-hole 61a which is smaller in size than the semiconductor device is formed in the central area of the bottom surface. A through hole 63a through which the handling head 50 is passed is formed in the central area of the beam portion 63. The handling head 50 passed through the through hole 63a abuts to a peripheral area of the air through-hole 61a on the pushing portion 61.

In order to prevent falling out of the pushing portion 61 from the through holes 62, top ends of both arms of the pushing portion 61 are bent laterally and further spring force of the coil springs 66 wounded around both arms is always applied to the pushing portion 61 downwardly.

The testing wiring substrate 41A to which the holder 60 having the above configuration is fitted has a similar configuration to that shown in FIGS. 21A and 21B except that tapered faces 41B are formed on both end faces. Like references in FIG. 23 refer to like elements in FIGS. 21A and 21B.

The testing carrier is constituted by the holder 60 and the testing wiring substrate 61A mentioned above. To fit the bare chip 40 to the testing carrier, following procedures will be taken.

First the bare chip 40 is positioned below the pushing portion 61 of the holder 60 so as to expose the electrodes 40a on the bare chip 40. Then the handling head 50 is passed through the through hole 63a of the beam portion 63 so as to abut against the top surface of the pushing portion 61. The bare chip 40 is attracted to the handling head 50 via the air through-hole 61a of the pushing portion 61 and at the same time the pushing portion 61 is attracted to the handling head 50.

Figure 24:
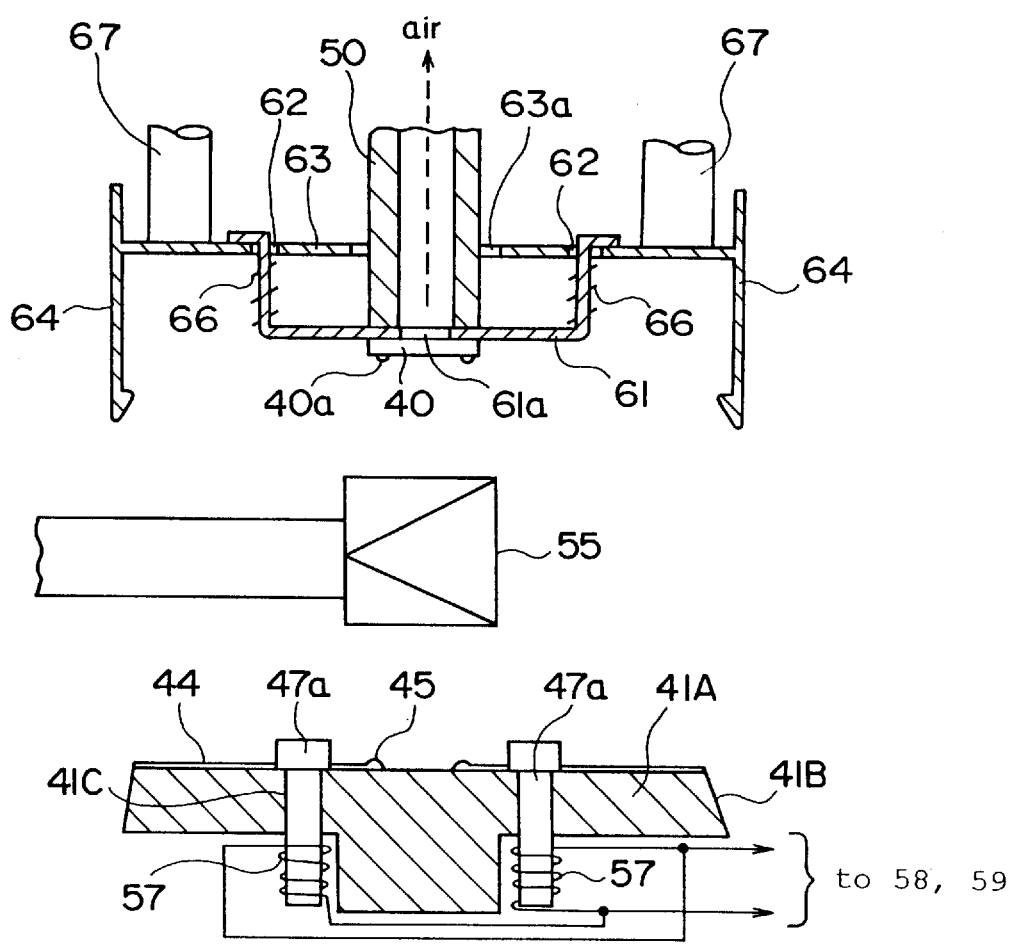
FIG. 24 is a sectional view showing the situation immediately before a semiconductor device is fitted into the testing carrier in the sixth embodiment of the present invention.

Subsequently, as shown in FIG. 24, the bare chip 40 is positioned over the testing wiring substrate 41A at a distance by moving the handling head 50. Then, locations of the contact terminals 45 of the testing wiring patterns 44 on the testing wiring substrate 41A and the electrodes 40a of the bare chip 40 are recognized by the location recognizing camera 55.

Based on data derived from the location recognizing camera 55, the handling head 50 is driven until the contact terminals 45 of the testing wiring patterns 44 on the testing wiring substrate 41A correspond to the electrodes 40a of the bare chip 40 one by one, as previously explained in the fifth embodiment.

Next, after removing the location recognizing camera 55 at an appropriate timing, the holder 60 is mounted on the testing wiring substrate 41A by descending the handling head 50.

The magnetic pieces 47a projecting from the testing wiring substrate 41A downwardly is kept in the situation where the magnet coils are wound around projected portions of the magnetic pieces 47a. If the magnetic field generating coils 57 are energized by current, the magnetic fields are concentrated along the magnetic pieces 47a. Thus, the magnetic pieces 47a attraction the pushing portion 61 of the holder 60 in virtue of their magnetic fields.

Figure 25:
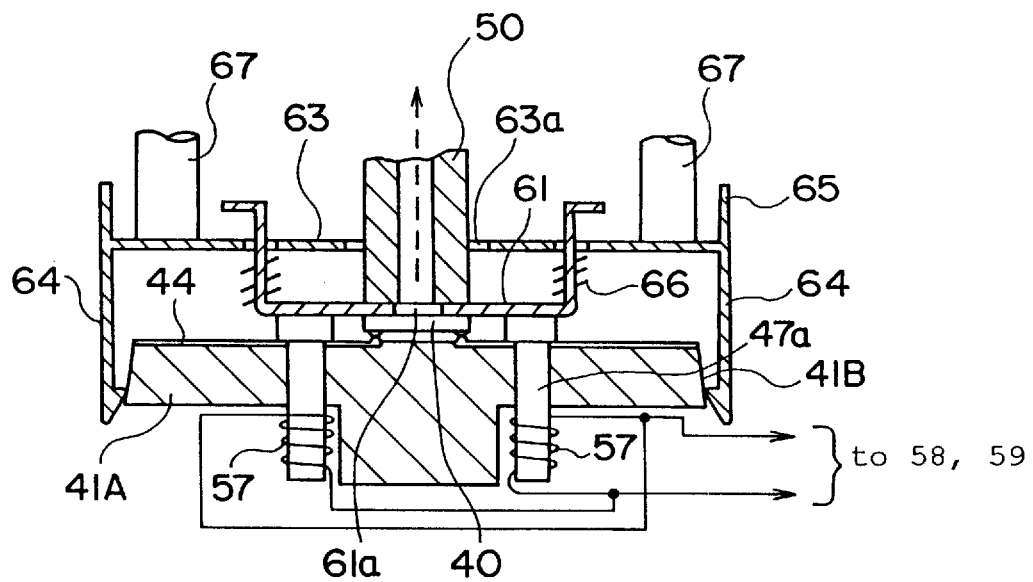
FIG. 25 is a sectional view showing procedures for fixing the semiconductor device to the testing carrier in the sixth embodiment of the present invention.

Under this condition, since a distance between the beam portion 63 and the bottom surface of the pushing portion 61 is not varied because of spring force of the coil springs 67, lower ends of the latch portions 64 do not reach the bottom surface of the testing wiring substrate 41A yet. Therefore, as shown in FIG. 25, if areas near both ends of the beam portions 63 are descended by the push pins 67 toward the testing wiring substrate 41A, the latch portions 64 are spread while the top ends thereof sliding on the tapered surfaces 41B of the testing wiring substrate 41A. At the time when the top ends of the latch portions 64 reach the bottom of the testing wiring substrate 41A, the latch portions 64 are suited to the testing wiring substrate 41A.

As a result, the beam portion 63 is fixed to the testing wiring substrate 41A. Moreover, if the pushing portion 61 is pushed downwardly by the push pins 67, spring forces generated by the coil springs 67 are applied to the beam portion 63, and therefore the pushing forces of the electrodes 40a on the bare chip 40 to the contact terminals 45 are enhanced. Accordingly, locations of the electrodes of the bare chip 40 and the contact terminals 45 are in no means displaced respectively by the shock caused by click of the latch portions 64.

Figure 26:
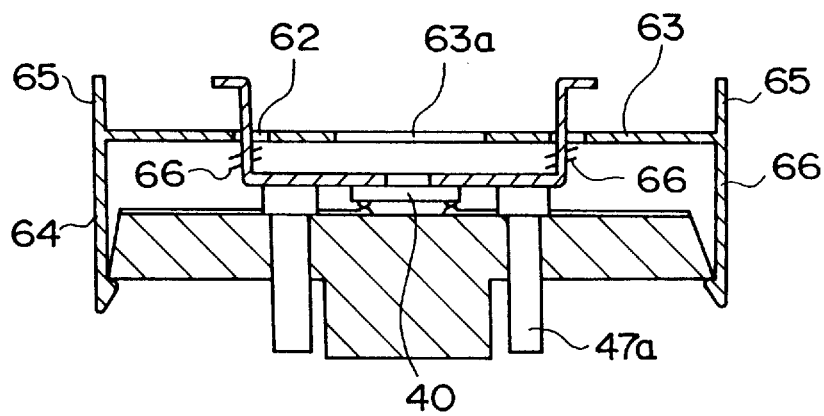
FIG. 26 is a sectional view showing the situation after the semiconductor device has been fixed in the testing carrier in the sixth embodiment of the present invention.

After the top ends of the latch portions 64 have caught the bottom of the testing wiring substrate 41A, the holder 60 is fixed to the testing wiring substrate 41A via the latch portions 64, and consequently the magnetic fields generated by the magnetic field generating coils 57 become unnecessary. Therefore, current supply to the magnetic field generating coils 57 is ceased. Then the handling head 50 and the pushing pins 67 are removed from the holder 60, as shown in FIG. 26, then the magnetic pieces 57 in the testing wiring substrate 41A are removed from the magnetic field generating coils 57, and then the testing wiring substrate 41A is carried to a testing apparatus.

In turn, the circuit performance test is carried out to the semiconductor device formed as the bare chip 40 by contacting the test probe to outer ends of the testing wiring substrate 41A, etc.

Because the testing wiring substrate 41A and the holder 60 are firmly fixed mutually via the latch portions 64 in testing the semiconductor device, they are never displaced by vibrations caused during the test, i.e., during conveyance from removal of the handling head 50 to finishing of the circuit performance test.

After completing the circuit performance test, if the latch releasing portions 65 are shifted inwardly, the latch portions 64 are spread outwardly because of the elasticity of the beam portion 63 to thus release the testing wiring substrate 41A and the bare chip 40 from the holder 60.

In order to eliminate displacement of the pushing portion 61 caused when the latch portions are clicked, it is preferable to form the opening portion 62 passing both arms of the pushing portion 61 therethrough as large as possible.

(Seventh embodiment)

In the above embodiments, fixing of the bare chip to the testing carrier has been explained. However, the test object is the packaged semiconductor device, otherwise the test object is fitted to the board type testing wiring substrate. Accordingly, in a seventh embodiment, the case will be explained where the packaged semiconductor device is fitted on the BI board.

Figure 27:
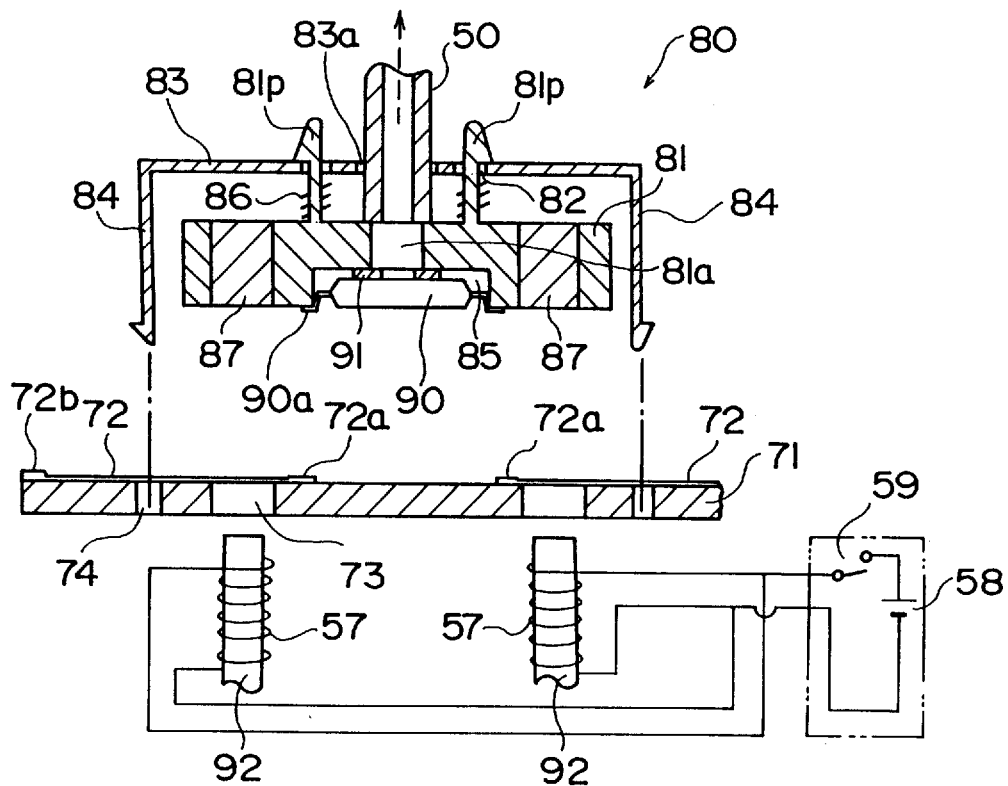
FIG. 27 is a sectional view showing the situation immediately before a semiconductor device is fitted into a testing carrier according to a seventh embodiment of the present invention.

FIG. 27 shows the situation before the packaged semiconductor device is held on the board type testing wiring substrate. The testing wiring substrate 71 is formed to have such a size that a plurality of semiconductor devices can be mounted thereon.

The holder 80 for holding the semiconductor device on the testing wiring substrate 71 comprises a substrate-like pushing portion 81, and a beam portion 83 coupled to the pushing portion 81. Pins 81p extending in the substantially vertical direction are provided at two points on the top surface of the pushing portion 81, and coil springs 86 are wound around respective pins 81p. Further, key type stoppers are provided on top ends of the pins 81p to prevent the pins 81p, which are passed through holes 82 in the beam portion 83, from being dropped out from the beam portion 83. Latch portions 84 are provided on both ends of the beam portion 83 downwardly. The latch portion 84 is designed to have a length so that the top end of the latch portion 84 is projected from the pushing portion 81 downwardly in the situation where the coil spring 86 is compressed.

The pushing portion 81 has a configuration analogous to that of the holding substrate 51 in the fifth embodiment. In other words, a concave portion 85 in which a semiconductor device 90 is arranged is formed in the central area of the pushing portion 81, and a through hole 81a for passing the pushing portion 81 therethrough is formed in the central area of the concave portion 85. Top ends of the handling head 50 passed through a through hole 83a which is formed in the central area of the beam portion 83 are designed to abut the peripheral area of the through hole 81a on the pushing portion 81. Magnetic pieces 87 being not magnetized are embedded at least two points around the concave portion 85.

Figure 28:
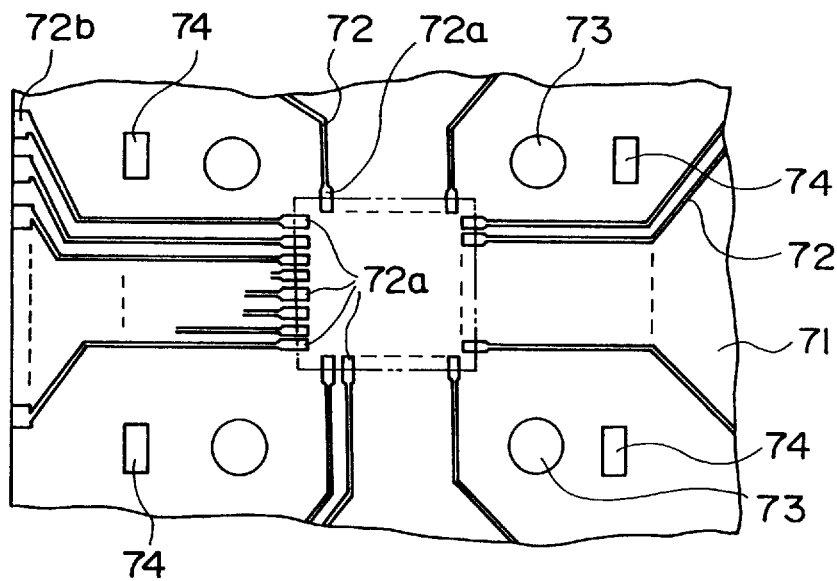
FIG. 28 is a plan view showing a part of board type testing wiring substrate in the seventh embodiment of the present invention.

As shown in FIG. 28, wirings 72 to be connected to a plurality of terminals 90a of the semiconductor device 90 are formed on a testing wiring substrate 71. Opening portions 73 are formed in the testing wiring substrate 71 at locations just beneath the magnetic pieces 87 of the holder 80 which is mounted at a predetermined position. In addition, latch portions 74 are formed in the testing wiring substrate 71 at locations just beneath the latch portions 84 of the holder 80 which is mounted at the predetermined position.

In FIG. 27, a reference 91 denotes a frame-like pad which is tightly contacted between the semiconductor device 90 and the pushing portion 81; 92, magnetic core which is positioned on a center axis of the magnetic field generating coil 57; 72a, contact terminal formed on an inner end portion of a wiring 72 on the testing wiring substrate 71; and 72b, outer terminal formed on an external end portion of the wiring 72.

The packaged semiconductor device 90 will be fitted on the testing wiring substrate 71 as follows.

The semiconductor device 90 is placed below the pushing portion 81 of the holder 80 to expose the terminals 90a of the semiconductor device 90. Furthermore, the handling head 50 is passed through the through hole 82 formed in the beam portion 83 to contact the periphery of the air through-hole 81a of the pushing portion 81. The semiconductor device 90 is sucked by pull force of the handling head 50 via the air through-hole 81a in the pushing portion 81 and then be fixed.

In turn, the semiconductor device 90 is opposed to the sample positioning area of the testing wiring substrate 71 by moving the handling head 50. Then, locations of the contact terminals 72a in the sample positioning area and the terminals 90a of the semiconductor device 90 are recognized by the location recognizing camera.

As previously explained in the fifth embodiment, based on data obtained from the location recognizing camera, the handling head 50 is moved until the contact terminals 72a correspond to the terminals 90a of the semiconductor device 90 one by one.

Next, after removing the location recognizing camera at an appropriate timing, the terminals 90a of the semiconductor device 90 are contacted to the contact terminals 72a by descending the handling head 50. At the same time, the magnetic cores 92 of the magnetic field generating coils 57 are pushed into the opening portions 73 from the lower side of the testing wiring substrate 71. In addition, the magnetic cores 92 and the magnetic pieces 87 are attracted in terms of the magnetic fields generated by the magnetic field generating coils 57 when the current is supplied to the magnetic field generating coils 57. Thereby, the pushing portion 81 of the holder 80 and the semiconductor device 90 are fixed to the testing wiring substrate 71.

Figure 29:
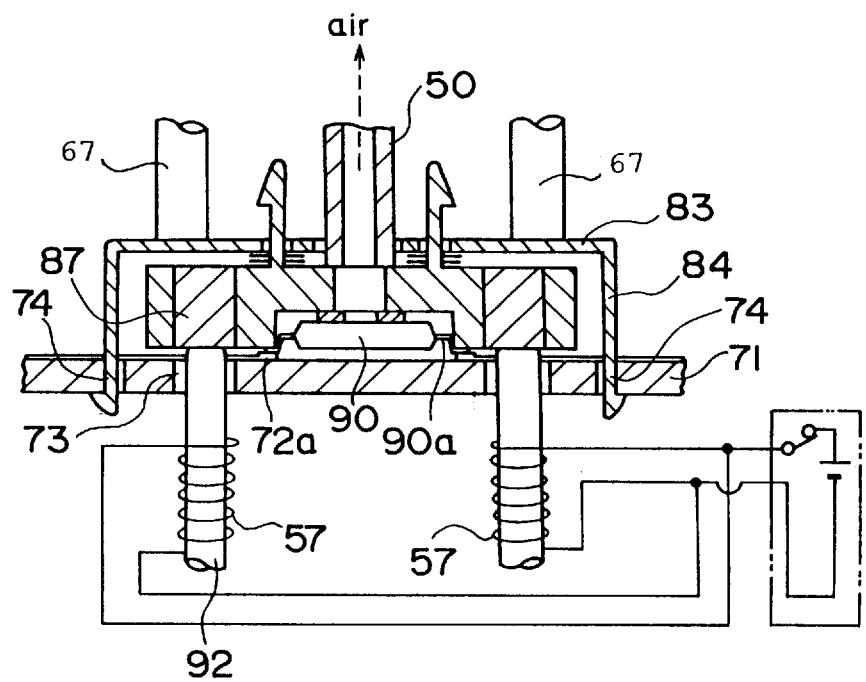
FIG. 29 is a sectional view showing procedures for fixing the semiconductor device to the testing carrier in the seventh embodiment of the present invention.

Then, as shown in FIG. 29, if the top surface of the beam portion 83 is pushed down by the push pins 67, the latch portions 84 are suited to the latch holes 74 in the testing wiring substrate 71 so that bent top ends of the latch portions 84 are engaged with the bottom surface of the testing wiring substrate 71. In this case, like the sixth embodiment, the pushing portion 81 is pushed against the testing wiring substrate 71 owing to spring force of the coil spring 86 and is kept in a fixed state.

Therefore, the terminals 90a of the semiconductor device 90 are held to be contacted to the contact terminals 72a in the testing wirings 72.

Figure 30:
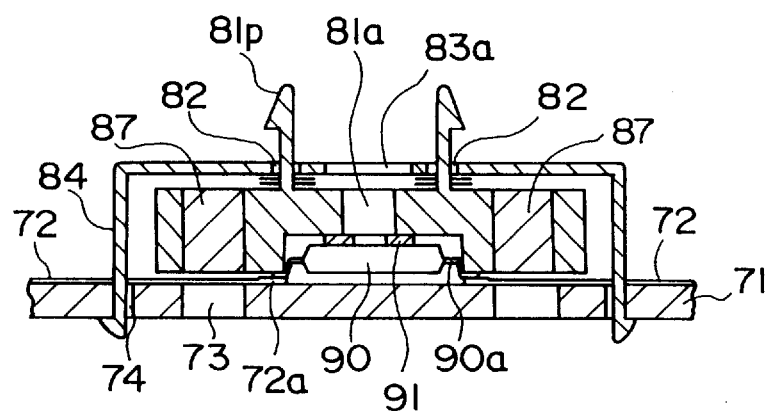
FIG. 30 is a sectional view showing the situation after the semiconductor device has been fitted in the testing carrier in the seventh embodiment of the present invention.

In this state, since the holder 80 is fixed to the testing wiring substrate 71 by the latch portions 84, the magnetic fields by the magnetic field generating coils 57 can be neglected. Therefore, as shown in FIG. 30, the handling head 50 and the push pins 67 are removed, and then current supply to the magnetic field generating coils 57 is stopped.

After the semiconductor devices 90 and the holders 80 have been fitted to the testing wiring substrate 71 at plural locations, the testing wiring substrate 71 is carried into the BI testing furnace, for example, to carry out the circuit performance test of the semiconductor device 90.

As stated above, since the testing wiring substrate 71 and the holder 80 are firmly fixed via the latch portion 84, they are not displaced by vibrations caused during conveyance or BI test.

(Eighth embodiment)

Figure 31A:
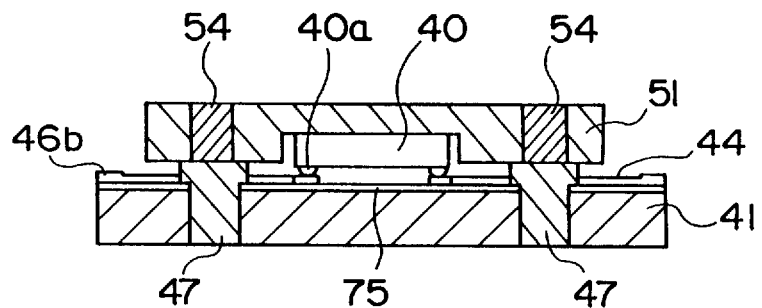
FIG. 31A is a sectional view showing a testing carrier according to a eighth embodiment of the present invention.
Figure 31B:
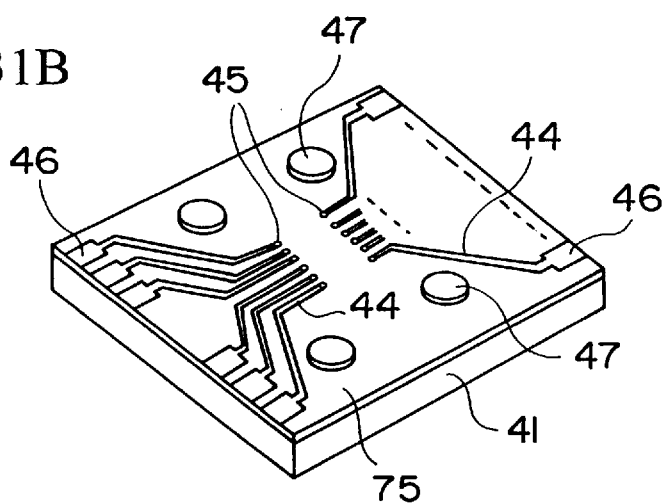
FIG. 31B is a perspective view showing a testing wiring substrate in the testing carrier in FIG. 31A.

FIGS. 31A and 31B shows a testing wiring substrate having a contact sheet called as a "membrane" which is formed on a top surface of the substrate. Like references in FIGS. 31A and 31B identify like elements in FIGS. 21A and 21B.

In the membrane, contact electrodes 45 are formed in a semiconductor mounting area on a film 75 having high electric insulation such as polyimide. On the film 75, with increasing their pitches and widths, a plurality of testing wiring patterns 44 are extended from contact electrodes 75 to outer terminals 46.

The testing wiring substrate is superior in mass-producibility to the case where the testing wiring patterns 44 are formed on the substrate if such membrane is used.

(Ninth embodiment) In the fifth embodiment, the configuration has been adopted wherein the holding substrate 51 and the semiconductor device 40 are fixed to the testing wiring substrate 41 by the magnet 54. However, there is a possibility that a magnetic field generated by the magnet 54 will cause malfunction of the semiconductor device.

Figure 32A:
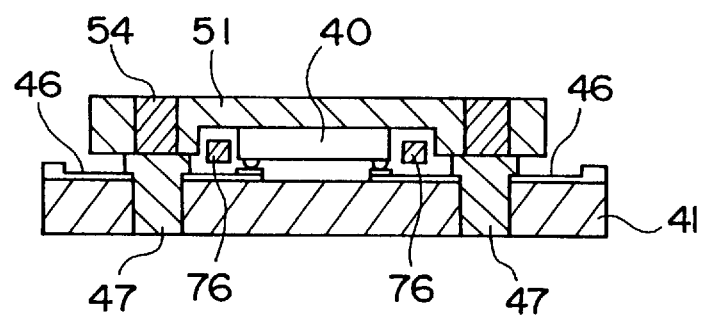
FIG. 32A is a sectional view showing a testing carrier according to a ninth embodiment of the present invention.
Figure 32B:
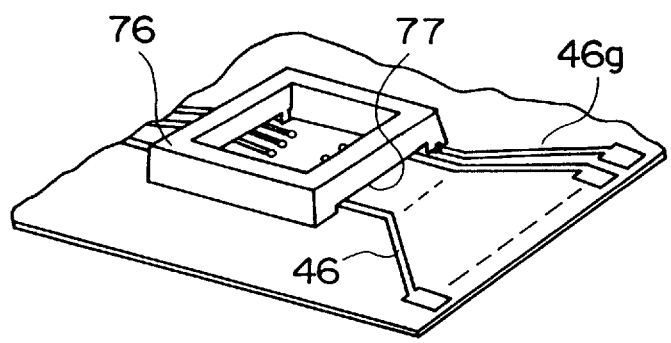
FIG. 32B is a perspective view showing a testing wiring substrate in the testing carrier in FIG. 32A.

Therefore, as shown in FIGS. 32A and 32B, in order to reduce influence of the external magnetic field upon the semiconductor device, it is preferable to arrange a magnetic shielding fence 76 surrounding the semiconductor device 40 on the testing wiring substrate 41. The magnetic shielding fence 76 is placed between a mounting area for the semiconductor device 40 and a mounting area for the magnet 54. The magnetic shielding fence 76 is formed of nonmagnetic substance such as copper, and has gates 77 which are laid across the testing wiring patterns 46 serving as signal lines and power lines. The magnetic shielding fence 76 is also connected to ground wiring patterns 46g, and serves to shield electrically the semiconductor device 40 during testing. The ground wiring patterns 46g are connected to ground terminal of a tester.

Figure 33:
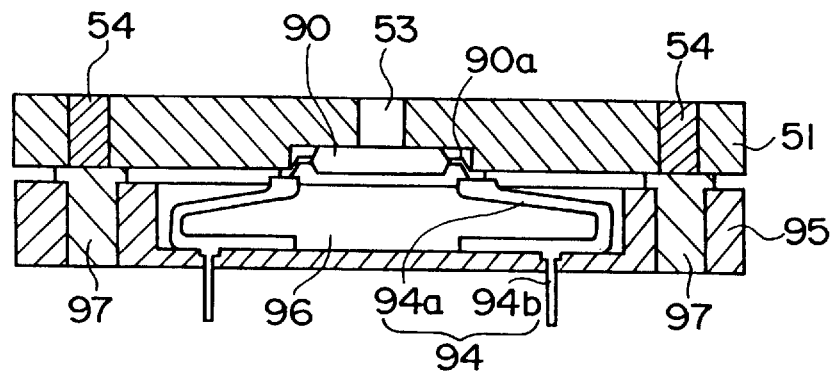
FIG. 33 is a sectional view showing a testing carrier according to a tenth embodiment of the present invention.

(Tenth embodiment) FIG. 33 shows an IC socket used in test of a QFP (Quad Flat Package) type semiconductor device, to which the configuration shown in the fifth embodiment is applied.

The IC socket 93 achieves a configuration wherein an elastic contact pin 94 has both functions of the elastic body 43 and the wiring patterns 44 shown in FIG. 18A. In other words, a concave portion 96 is formed in the mounting area for the semiconductor device and its neighboring area of the testing wiring substrate 95, and a plurality of contact pins 94 are fitted within the concave portion 96.

The contact pins 94 is formed by arranging a conductive U(or V)-shaped spring 94a laterally and connecting plugs 94b to a bottom surface of the spring 94a. The plugs 94b are inserted into a bottom of the concave portion 96 to project from a bottom surface of the testing wiring substrate 95 downwardly.

Magnetic pieces 97 are fitted around the concave portion 96 of the testing wiring substrate 95 so as to contact to the magnet 54 on the holding substrate 51. The holding substrate 51 has a configuration similar to that shown in FIGS. 18A and 18B and 20 other than its size.

In the IC socket 93 having the above configuration, like the fifth embodiment, the semiconductor device 90 and the holding substrate 51 are also mounted on the testing wiring substrate 95 by using the handling head 50. In this situation, the holding substrate 51 and the testing wiring substrate 95 are tightly fixed together by attraction between the magnet 54 and the magnetic piece 97. Respective terminals 90a projecting from side surfaces of the semiconductor device 90 are contacted to top ends of springs 94a of respective contact pins, and are pushed against the holding substrate 51 by elasticity of the springs per se.

(11th embodiment)

Figure 34A:
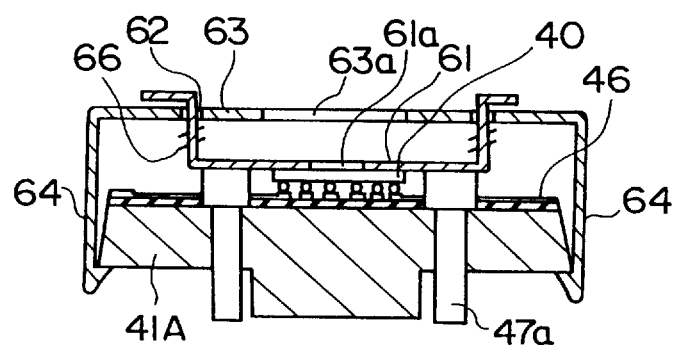
FIG. 34A is a sectional view showing a testing carrier according to a 11th embodiment of the present invention.
Figure 34B:
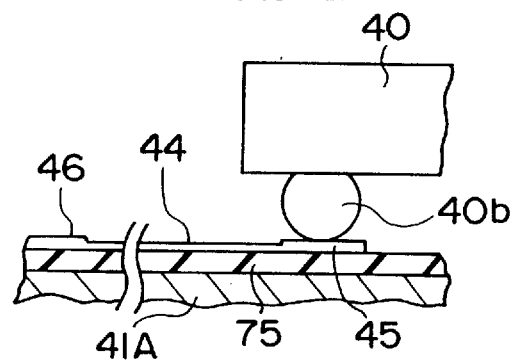
FIG. 34B is an enlarged view showing the situation where a bare chip and a testing wiring substrate in the testing carrier in FIG. 34A are connected.

As shown in FIGS. 34A and 34B, the bare chip 40 on which solder bumps 40b are formed may be fitted in the testing carrier shown in FIG. 24. However, since the solder bumps 40b are arranged on a surface of the bare chip 40 in a matrix fashion, a multilayered wiring layer structure may be adopted in the event that a density of the wiring patterns 44 is enhanced.

In FIGS. 34A and 34B, a structure is adopted wherein a membrane is formed on the testing wiring substrate 41B.

(12th embodiment)

Figure 35A:
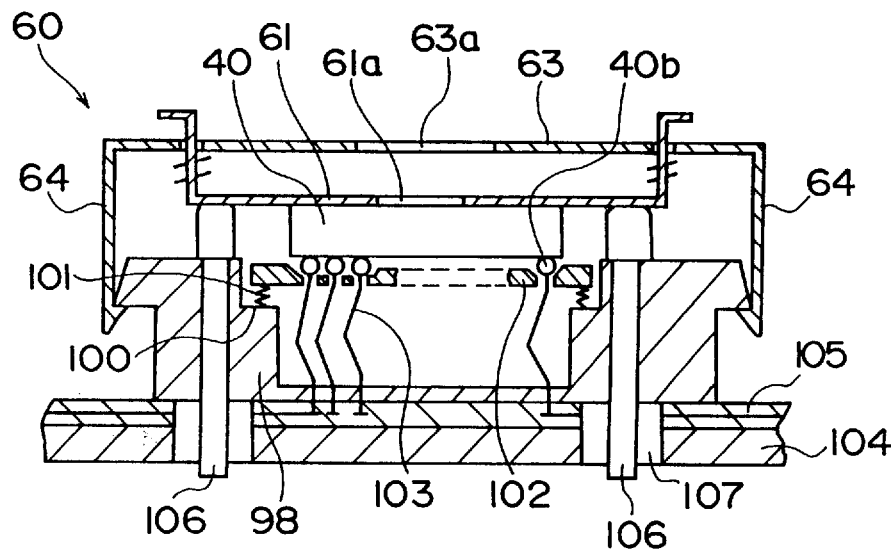
FIG. 35A is a sectional view showing a testing carrier according to an 12th embodiment of the present invention.

FIG. 35A is a sectional view showing a configuration in which a concave portion 99 being is wider than the semiconductor device is formed in a housing 98 and a step 100 is formed around the concave portion 99. A spring 101 put on the step 100 supports a lid 102 of the concave portion 99. A stylus-like pin 103 being erected on a bottom of the concave portion 99 penetrates a recess of the lid 102. The pin 103 is made of conductive elastic substance, and is bent slightly. A lower end of the pin 103 is projected from a bottom surface of the housing so as to be connected to wiring patterns 105 on a board type testing wiring substrate 104. The housing 98 is adhered to the board type testing wiring substrate 104.

Magnetic pieces 106 extruding vertically through the housing 98 are embedded around the concave portion 99. Lower ends of the magnetic pieces 106 penetrate opening portions 107 of the testing wiring substrate 104. Top ends of the magnetic pieces 106 are arranged to be able to contact the pushing portion 61 of the holder 60, and are sucked to the pushing portion 61 in the situation when the magnetic pieces 106 are magnetized by a magnetic field generating coil (not shown).

In this configuration, the holder 60 is fitted to the housing 98 by the foregoing method described in the sixth embodiment.

Figure 35B:
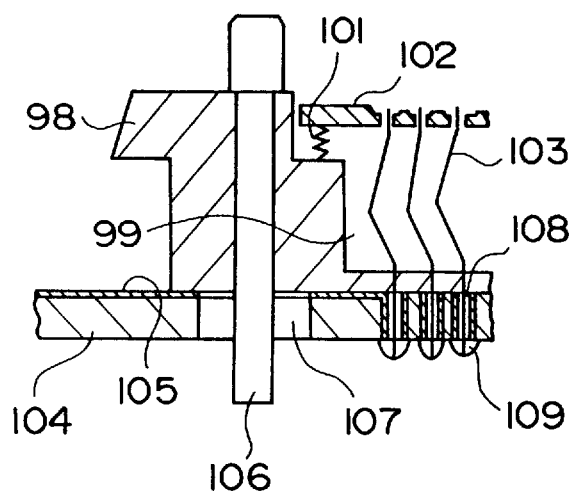
FIG. 35B is a fragmental sectional view showing a partial variation of the testing carrier in FIG. 35A.

As the structure for electrically connecting the pins 103 to the wirings 105 on the testing wiring substrate 104, what is shown in FIG. 35B can be used in addition to that in FIG. 35A. In the wirings 105 and the testing wiring substrate 104 in FIG. 35B, through holes 108 each having a conductive film on its inner surface are provided at the locations against which the pins 103 projected from the bottom surface of the housing 98 abut. The pins 103 are inserted into the through holes 108, and the pins 103 in the through holes 108 and the testing wiring substrate 104 are fixed by solders 109. Further, the wirings 105 and the pins 103 are electrically conducted via the solders 109 and the through holes 107. The solders 109 are attached by solder reflow.

In FIGS. 35A and 35B, like reference symbols identify like elements in FIG. 24.

(13th embodiment)

Figure 36:
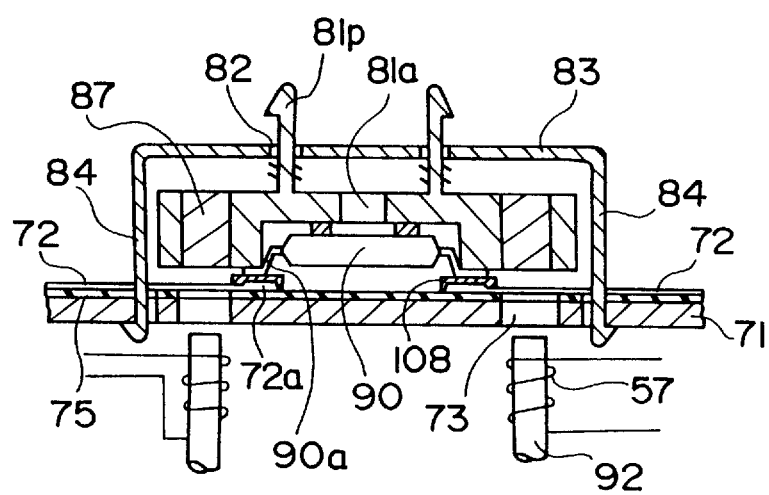
FIG. 36 is a sectional view showing a testing carrier according to a 13th embodiment of the present invention.

FIG. 36 shows the situation where anisotropic rubber sheets 108 are fitted respectively on contact terminals 72a of wirings 72 which are formed on the testing wiring substrate 71 shown in FIG. 28. The anisotropic rubber sheet 108 has a frame-like planar shape to overlap with the contact terminal 72a, as shown by a chain double-dashed line in FIG. 28.

Conductive fibers are buried in the anisotropic rubber sheet 108 in the vertical direction. In the anisotropic rubber sheet 108, a top surface and a bottom surface of the sheet are conducted via the conductive fibers, but the sheet has high resistance in the direction along the surface.

Since surface unevenness of the contact terminal 72a and its neighboring area can be reduced if the contact terminal 72a is covered by such anisotropic rubber sheet 108, the terminal 90a of the semiconductor device 90 can be positioned stably on the contact terminal 72a.

What is claimed is:

1. An apparatus for holding a semiconductor device comprising:

a substrate having wirings thereon on which electrodes or terminals of said semiconductor device are superposed;

a holding body for holding said semiconductor device and pushing said semiconductor device against said substrate;

a magnet attached, to either of said holding body and said substrate, in a peripheral region of said semiconductor device;

a magnet portion formed of magnetic substance, which is provided on either of said substrate and said holding body, so as to oppose said magnet;

an elastic body embedded in said substrate beneath a certain region of said wirings on which said semiconductor device is mounted; and a magnetic field generating portion for applying a magnetic field to said magnetic portion in an opposite direction to a magnetic field of said magnet after completion of a circuit performance test of said semiconductor device.

2. An apparatus for holding a semiconductor device according to claim 1, further comprising;

an air through-hole formed in said holding body; and a handling head for attracting said semiconductor device via said air hole.

3. An apparatus for holding a semiconductor device according to claim 1, further comprising;

a magnetic shielding formed on either of said holding body and said substrate so as to surround said semiconductor device.

4. An apparatus for holding a semiconductor device according to claim 1, wherein said wirings formed on said substrate are pins which are formed of elastic substance and arranged in concave portions formed on said substrate.

5. An apparatus for holding a semiconductor device according to claim 4, wherein lower ends of said pins are projected from a bottom surface of said substrate outwardly.

6. An apparatus for holding a semiconductor device according to claim 1, wherein said wirings are formed on an insulating sheet, and said insulating sheet is formed on said substrate.

7. An apparatus for holding a semiconductor device according to claim 1, further comprising;

anisotropic conductive films each having electric resistance in a vertical direction lower than that in a lateral direction are put on respective areas of said wirings formed on said substrate, said respective areas being to be contacted to electrodes or terminals of said semiconductor device.

8. A method of fixing/detaching a semiconductor device comprising the steps of:

attracting said semiconductor device by handling head via an air through-hole formed in a holding body, and sandwiching said holding body between said semiconductor device and said handling head;

moving said semiconductor device and said holding body by said handling so as to oppose a substrate at a distance;

moving said semiconductor device and said holding body by said handling head so as to oppose electrodes or terminals of said semiconductor device to a certain region of wiring formed on said substrate, wherein an elastic body is embedded in said substrate beneath the certain region of the wirings;

moving said holding body toward said substrate so as to contact said electrodes or terminals of said semiconductor device with said wirings, and then attracting said holding body and said substrate to be fixed magnetically by means of a set of a magnet and a magnet piece which are positioned in a peripheral region of said semiconductor device;

releasing attraction of said semiconductor device by said handling head; and generating a magnetic field, opposite to a magnetic field generated by said magnet, through said magnetic piece after completion of a current performance test of said semiconductor device and then separating said holding body from said substrate by virtue of a repulsive power acting between said magnet and said magnetic piece.

9. A method of fixing/detaching a semiconductor device according to claim 8, further comprising the steps of:

under situations where terminals or electrodes of said semiconductor device are contacted to wirings on a substrate, said semiconductor device is pushed against said substrate by a holding body, and said substrate and said holding body are fixed mutually by a pull force acting between said magnet and said magnet piece.

10. An apparatus for holding a semiconductor device comprising:

a substrate having wiring on which electrodes and terminals of said semiconductor device are to be superposed, and insertion holes formed in a peripheral region between said wirings;

magnetic field generating portions which are inserted into said insertion holes formed in said substrate;

a holding body fitted to said substrate to hold said semiconductor device, at least portions of said holding body opposed to said insertion holes being formed of magnetic substance;

an elastic body embedded in said substrate beneath a certain region of said wirings on which said semiconductor device is mounted; and a magnetic field generating portion for applying a magnetic field to said magnetic portion in an opposite direction to a magnetic field of said magnet after completion of a circuit performance test of said semiconductor device.

11. An apparatus for holding a semiconductor device according to claim 10, wherein said magnetic field generating portions are formed by magnetic cores on which coils are wound.

12. An apparatus for holding a semiconductor device according to claim 10, further comprising:

an air through-hole formed in said holding body; and a handling head for attracting said semiconductor device via said air hole.

13. An apparatus for holding a semiconductor device according to claim 10, wherein said holding body includes a pushing portion having springs for pushing said semiconductor device against said substrate.

14. An apparatus for holding a semiconductor device according to claim 10, wherein said wirings formed on said substrate are pins which are formed of elastic substance and arranged in concave portions formed on said substrate.

15. An apparatus for holding a semiconductor device according to claim 14, wherein said pins are projected from a bottom surface of said substrate outwardly.

16. An apparatus for holding a semiconductor device according to claim 10, further comprising:

an insulating sheet interposed between said wirings and said substrate.

17. An apparatus for holding a semiconductor device according to claim 10, further comprising;

anisotropic conductive films each having electric resistance in a vertical direction lower than that in a lateral direction are put on respective areas of said wirings formed on said substrate, said respective areas being to be contacted to electrodes or terminals of said semiconductor device.

18. A method of fixing a semiconductor device comprising the steps of:

attracting said semiconductor device by a handling head via an air through-hole formed in a holding body, and sandwiching a part of said holding body between said semiconductor device and said handling head;

moving said semiconductor device and said holding body by said handling head so as to oppose a substrate at a distance;

moving said semiconductor device and said holding body by said handling head so as to oppose electrodes or terminals of said semiconductor device to a certain region of wiring formed on said substrate, wherein an elastic body is embedded in said substrate beneath the certain region of the wirings;

moving said holding body toward said substrate so as to contact said electrodes of terminals of said semiconductor device with said wirings, and then attracting said holding body and said substrate to be fixed magnetically by means of a set of magnetic and magnetic portion which are positioned in a peripheral region of said semiconductor device;

fixing said holding body to said substrate mechanically;

releasing attraction of said semiconductor device by said handling head, and releasing magnetic attraction between said holding body and said substrate; and generating a magnetic field, opposite to a magnetic field generated by said magnet, through said magnetic piece after completion of a current performance test of said semiconductor device and then separating said holding body from said substrate by virtue or repulsive power acting between said magnet and said magnetic piece.

* * * * *